(12) United States Patent
Arelakis et al.

(10) Patent No.: US 10,476,520 B2
(45) Date of Patent: Nov. 12, 2019

(54) METHODS, DEVICES AND SYSTEMS FOR HYBRID DATA COMPRESSION AND DECOMPRESSION

(71) Applicant: Zeropoint Technologies AB, Göteborg (SE)

(72) Inventors: Angelos Arelakis, Göteborg (SE); Per Stenström, Torslanda (SE)

(73) Assignee: Zeropoint Technologies AB, Göteborg (SE)

( * ) Notice: Subject to any disclaimer, the term of this patent is extended or adjusted under 35 U.S.C. 154(b) by 3 days.

(21) Appl. No.: 15/575,007

(22) PCT Filed: May 20, 2016

(86) PCT No.: PCT/SE2016/050462
§ 371 (c)(1),
(2) Date: Nov. 17, 2017

(87) PCT Pub. No.: WO2016/186563
PCT Pub. Date: Nov. 24, 2016

(65) Prior Publication Data
US 2018/0138921 A1 May 17, 2018

(30) Foreign Application Priority Data

May 21, 2015 (SE) .................................... 1550644
Jan. 29, 2016 (SE) .................................... 1650119

(51) Int. Cl.
*H03M 7/34* (2006.01)
*H03M 7/30* (2006.01)
(Continued)

(52) U.S. Cl.
CPC .......... *H03M 7/6088* (2013.01); *G06F 3/064* (2013.01); *G06F 3/0608* (2013.01);
(Continued)

(58) Field of Classification Search
CPC ............ H03M 7/00; H03M 5/00; H03M 7/40; H03M 7/42
(Continued)

(56) References Cited

U.S. PATENT DOCUMENTS 5,467,087 A * 11/1995 Chu .................... H03M 7/3086
341/51
5,805,932 A 9/1998 Kawashima et al.
(Continued)

FOREIGN PATENT DOCUMENTS

EP 1074945 A2 2/2001
EP 1107117 A2 6/2001
(Continued)

OTHER PUBLICATIONS

Dusser, J. et al., Zero-content Augmented Caches. Proceedings of the 23rd International Conference on Supercomputing (ICS '09) (2009) (23 pages).
(Continued)

*Primary Examiner* — Joseph J Lauture
(74) *Attorney, Agent, or Firm* — Ballard Spahr LLP

(57) ABSTRACT

Methods, devices and systems enhance compression and decompression of data blocks of data values by selecting the best suited compression method and device among two or a plurality of compression methods and devices, which are combined together and which said compression methods and devices compress effectively data values of particular data types; said best suited compression method and device is selected using as main selection criterion the dominating data type in a data block by predicting the data types within said data block.

37 Claims, 26 Drawing Sheets

(51) Int. Cl.
*H03M 7/48* (2006.01)
*G06F 3/06* (2006.01)
*H03M 7/00* (2006.01)
*H03M 5/00* (2006.01)
*H03M 7/40* (2006.01)
*H03M 7/42* (2006.01)

(52) U.S. Cl.
CPC ............ *G06F 3/0679* (2013.01); *H03M 7/30* (2013.01); *H03M 7/3071* (2013.01); *H03M 7/48* (2013.01); *H03M 5/00* (2013.01); *H03M 7/00* (2013.01); *H03M 7/40* (2013.01); *H03M 7/42* (2013.01)

(58) Field of Classification Search
USPC .................................. 341/51, 50, 65, 67, 106
See application file for complete search history.

(56) References Cited

U.S. PATENT DOCUMENTS

| | | |
|---|---|---|
| 7,190,284 B1 | 3/2007 | Dye et al. |
| 8,497,788 B1 | 7/2013 | Miller et al. |
| 2002/0097172 A1 | 7/2002 | Fallon |
| 2006/0139188 A1 | 6/2006 | Sasakura |
| 2008/0152235 A1 | 6/2008 | Bashyam et al. |
| 2008/0228998 A1 | 9/2008 | Colecchia et al. |
| 2009/0245382 A1 | 10/2009 | Ekman |
| 2013/0007076 A1 | 1/2013 | Wegener |
| 2013/0311722 A1 | 11/2013 | Arelakis et al. |
| 2014/0022098 A1 | 1/2014 | Fallon |
| 2014/0101485 A1 | 4/2014 | Wegener |
| 2019/0034091 A1 | 1/2019 | Arelakis et al. |
| 2019/0034334 A1 | 1/2019 | Arelakis et al. |

FOREIGN PATENT DOCUMENTS

| | | |
|---|---|---|
| SE | 1650767 A1 | 7/2017 |
| WO | WO-2011/033381 A1 | 3/2011 |
| WO | WO-2016/186563 A1 | 11/2016 |
| WO | WO-2016/186564 A1 | 11/2016 |
| WO | WO-2017/131578 A1 | 8/2017 |
| WO | WO-2017/131579 A1 | 8/2017 |

OTHER PUBLICATIONS

Pekhimenko, G. et al., Base-Delta-Immediate Compression: Practical Data Compression for On-Chip Caches. Proceedings of the 21st International Conference on Parallel Architectures and Compilation Techniques (PACT '12) (2012) (12 pages).
International Search Report and Written Opinion dated Aug. 26, 2016 by the International Searching Authority for Patent Application No. PCT/SE2016/050462, which was filed on May 20, 2016 and published as WO 2016/186563 on Nov. 24, 2016 (Inventor—Arelakis et al.; Applicant—Seropoint Technologies AB) (13 pages).
International Preliminary Report on Patentability dated Apr. 21, 2017 by the International Searching Authority for Patent Application No. PCT/SE2016/050462, which was filed on May 20, 2016 and published as WO 2016/186563 on Nov. 24, 2016 (Inventor—Arelakis et al.; Applicant—Seropoint Technologies AB) (6 pages).
Arelakis, A., et al. "A case for a value-aware cache", IEEE Computer Architecture Letters, vol. 13, No. 1, pp. 1-4, Jan. 21, 2014; abstract; Sections 2 and 5.
Islam, M., et al., "Characterizing and Exploiting Small-Value Memory Instructions," in IEEE Transactions on Computers, vol. 63, No. 7, pp. 1640-1655, Jul. 2014; abstract; Section 6.
Thuresson, M., et al., "Memory-Link Compression Schemes: A Value Locality Perspective," in IEEE Transactions on Computers, vol. 57, No. 7, pp. 916-927, Jul. 2008.; abstract; Sections 1, 3, and 6.
Wikipedia, "Floating-point arithmetic" URL: https://en.wikipedia.org/w/index.php?tide=Floatingpoint_arithmetic&oldid=661666669 [retrieved Nov. 30, 2018] (25 pages).
Isenburg M et al: "Lossless compression of predicted floating-point geometry",Computer Aided Design, vol. 37, No. 8, Jul. 1, 2005 (Jul. 1, 2005), pp. 869-877.
European Search Report was dated Dec. 12, 2018 by the European Patent Office for EP Application No. 16796838.7, filed on May 20, 2016 and published as EP 3304746 A1 on Apr. 11, 2018 (Applicant—Zeropoint Technologies AB)(11 Pages).

* cited by examiner

Hybrid data
decompression
method
2900

2910
Select an estimated best suited data
decompression scheme among a plurality of data
decompression schemes

2920
Decompress the whole of a compressed data block
by the selected estimated best suited data
decompression scheme to generate a
decompressed data block

FIG. 29

METHODS, DEVICES AND SYSTEMS FOR HYBRID DATA COMPRESSION AND DECOMPRESSION

CROSS-REFERENCE TO RELATED APPLICATIONS

This is a U.S. National Phase Application based on PCT/SE2016/050462, filed May 20, 2016, which claims priority from Swedish patent application No 1550644-7, filed on 21 May 2015 and bearing the title "METHODS, DEVICES AND SYSTEMS FOR DATA COMPRESSION AND DECOMPRESSION", the contents of which are incorporated herein in their entirety by reference. This U.S. National Phase Application based on PCT/SE2016/050462, filed May 20, 2016, also claims priority from Swedish patent application No 1650119-9, filed on 29 Jan. 2016 and bearing the title "METHODS, DEVICES AND SYSTEMS FOR DECOMPRESSING DATA", the contents of which are incorporated herein in their entirety by reference.

TECHNICAL FIELD

The disclosure of this patent application generally relates to the field of data compression and decompression, for instance in a cache/memory subsystem and/or in a data transferring subsystem of a computer system, or in a data communication system.

BACKGROUND OF THE DISCLOSURE

Data compression is a well-established technique that is used to reduce the size of the data. It is applied to data that are saved in the memory subsystem of a computer system to increase the memory capacity. It is also used when data are transferred either between different subsystems within a computer system or in general when the transfer takes place between two points in a data communication system comprising a communication network.

Data compression requires two fundamental operations: 1) compression (also referred to as encoding) that takes as input uncompressed data and transform them to compressed data by replacing data values by respective codewords (also mentioned in the literature as encodings, codings or codes) and 2) decompression (also referred to as decoding) which takes as input compressed data and transform them to uncompressed by replacing the codewords with the respective data values. Data compression can be lossless or lossy depending on whether the actual data values after decompression are exactly the same to the original ones before being compressed (in lossless) or whether the data values after decompression are different than the original ones and the original values cannot be retrieved (in lossy). Compression and decompression can be implemented in software, or hardware, or a combination of software and hardware realizing the respective methods, devices and systems.

An example of a computer system 100 is depicted in FIG. 1. The computer system 100 comprises one or several processing units P1 . . . Pn connected to a memory hierarchy 110 using a communication means, e.g., an interconnection network. Each processing unit comprises a processor (or core) and can be a CPU (Central Processing Unit), a GPU (Graphics Processing Unit) or in general a block that performs computation. On the other hand, the memory hierarchy 110 constitutes the storage subsystem of the computer system 100 and comprises a cache memory 120, which can be organized in one or several levels L1-L3, and a memory 130 (a.k.a. primary memory). The memory 130 may also be connected to a secondary storage (e.g., a hard disk drive, a solid state drive, or a flash memory). The memory 130 can be organized in several levels, for example, a fast main memory (e.g., DDR) and a flash memory. The cache memory 120 in the current example comprises three levels, where the L1 and L2 are private caches as each of the processing units P1-Pn is connected to a dedicated L1/L2 cache, whereas the L3 is shared among all the processing units P1-Pn. Alternative examples can realize different cache hierarchies with more, fewer or even no cache levels, and with or without dedicating caches to be private or shared, various memory levels, with different number of processing units and in general different combinations between the processing units and the memory subsystem, as is all readily realized by a skilled person.

Data compression can be applied to a computer system in different ways. FIG. 2 depicts an example 200 of a computer system, like for instance system 100 of FIG. 1, where data are compressed in the memory, for example in the main memory of such computer system. This means that data are compressed before being saved in the memory by a respective compression operation as mentioned above, and data are decompressed when they leave the memory.

In an alternative example 300 of a computer system, shown in FIG. 3, data compression can be applied to the L3 cache of the cache system. Similarly to the previous example, compression is required before data are saved in the cache and decompression is required before data leave the cache (e.g., to other cache levels (L2) or to the memory 330 where data are uncompressed). In alternative examples data can be saved compressed in any level of the cache hierarchy.

Data can be also compressed only when they are transferred between different subsystems in the computer system. In the alternative example 400 of a computer system shown in FIG. 4, data are compressed when transferred between the L3 cache and the memory 430 using the respective communication means. Similarly to previous examples, compression and decompression need to exist in the ends of the communication means so that data are compressed before being transferred and decompressed when they are received at the other end.

In an alternative example 500 of a computer system, data compression can be applied in a combination of subsystems as depicted in FIG. 5. In this example, data are compressed when they are saved in the memory 530 and when they are transferred between the memory 530 and the cache hierarchy 520. In this way, when data are moved from the cache hierarchy 520 to the memory 530, they may only need to be compressed before being transferred from the L3 cache. Alternatively, the compressed data that leave the memory 530 to the cache hierarchy 520 may only need to be decompressed when they are received to the other end of the communication means that connect the memory 530 to the cache hierarchy 520. Regarding the combination of applying compression to the different subsystems in a computer system, any example is possible and can be realized by someone skilled in the art.

Transfer of data can also take place between two arbitrary points within a communication network. FIG. 6 depicts an example of a data communication system 600 comprising a communication network 605 between two points, where data are transferred by a transmitter 610 and received by a receiver 620. In such an example, these points can be two intermediate nodes in a network or the source and destination nodes of a communication link or a combination of these cases. Data compression can be applied to such a data communication system, as is depicted for an example system 700 in FIG. 7. Compression needs to be applied before data are transmitted by a transmitter 710 onto a communication network 705, while decompression needs to be applied after received by a receiver 720.

There is a variety of different algorithms (schemes) to realize data compression. One family of data compression algorithms are the statistical compression algorithms, which are data dependent and can offer compression efficiency close to entropy because they assign variable-length (referred to also as variable-width) codes based on the statistical properties of the data values: short codewords are used to encode data values that appear frequently and longer codewords encode data values that appear less frequently. Huffman encoding is a known statistical compression algorithm.

A known variation of Huffman encoding that is used to accelerate decompression is canonical Huffman encoding. Based on this, codewords have the numerical sequence property meaning that codewords of the same length are consecutive integer numbers.

Examples of canonical Huffman-based compression and decompression mechanisms are presented in prior art. Such compression and decompression mechanisms can be used in the aforementioned examples to realize Huffman-based compression and decompression.

An example of a compressor 900 from the prior art, which implements Huffman encoding e.g., canonical Huffman encoding, is illustrated in FIG. 9. It takes as input an uncompressed block, which is a stream of data values and comprises one or a plurality of data values generally denoted v1, v2, . . . , vn throughout this disclosure. The unit 910, which can be a storage unit or an extractor of data value out from the uncompressed block, supplies the Variable-length Encoding Unit 920 with data values. The Variable-length Encoding Unit 920 comprises the Code Table (CT) 922 and the codeword (CW) selector 928. The CT 922 is a table that can be implemented as a Look Up Table (LUT) or as a computer cache memory (of any arbitrary associativity) and contains one or a plurality of entries; each entry comprises a value 923 that can be compressed using a codeword, a CW 925 and a codeword-length (cL) 927. Because the set of the various codewords used by statistical compression algorithms is of variable-length, they must be padded with zeros when they are saved in the CT 922 where each entry has a fixed-size width (codeword 925). The codeword-length 927 keeps the actual length of the variable-length encoding (e.g., in bits). The CW selector 928 uses the cL in order to identify the actual CW and discard the padded zeros. The coded value is then concatenated to the rest of compressed values that altogether form the compressed block. An exemplary flow chart of a compression method that follows the compression steps as previously described is depicted in FIG. 11.

An example of a decompressor 1000 from the prior art is illustrated in FIG. 10. Canonical Huffman decompression can be divided into two steps: Codeword detection and Value retrieve. Each of these steps is implemented by a unit: (1) Codeword Detection Unit (CDU) 1020 and (2) Value Retrieve Unit (VRU) 1030. The aim of CDU 1020 is to find a valid codeword within a compressed sequence (i.e., the sequence of the codewords of the compressed data values). The CDU 1020 comprises a set of comparators 1022 and a priority encoder 1024. Each comparator 1022a,b,c compares each potential bit-sequence to a known codeword, which is in this example the First-assigned (at the time of code generation) canonical Huffman codeword (FCW) for a specific length. In alternative implementation, the last-assigned canonical Huffman codeword could be used too, but in that case the exact comparison made would be different. The maximum size of the aforementioned bit-sequence to be compared, which can be saved in a storage unit 1010 (implemented for example as a FIFO or flip flops) and which determines the number of comparators and the maximum width of the widest of them, depends on the maximum length of a valid Huffman codeword (mCL) that is decided at code generation. However, this maximum length can be bounded to a specific value at design, compile, configuration or run time depending on the chosen implementation of such decompressor (e.g., in software or in hardware). The output of the comparators 1022 is inserted into the priority encoder like structure 1024 which outputs the length of the matched codeword (referred to as "matched length" in FIG. 10). Based on this, the detected valid codeword (matched codeword) is extracted from the bit-sequence which is saved in a storage unit 1010; the bit sequence is shifted by as many positions as the "matched length" defines and the empty part is loaded with the next bits of the compressed sequence so that the CDU 1020 can determine the next valid codeword.

The Value Retrieve Unit (VRU) 1030, on the other hand, comprises the Offset table 1034, a subtractor unit 1036 and the Decompression Look Up Table (DeLUT) 1038. The "matched length" from the previous step is used to determine an offset value (saved in the Offset table 1034) that must be subtracted (1036) from the arithmetic value of the matched codeword, determined also in the previous step, to get the address of the DeLUT 1038 where the original data value that corresponds to the detected codeword can be retrieved from it and attached to the rest of decompressed values that are kept in the Decompressed block 1040. The operation of the decompressor is repeated until all the values that are saved compressed in the input compressed sequence (mentioned as compressed block in FIG. 10) are retrieved as uncompressed data values v1, v2, . . . , vn.

An exemplary flow chart of a decompression method that follows the decompression steps as previously described is depicted in FIG. 12.

The aforementioned compressor and decompressor can quickly and effectively compress blocks of data with variable-length Huffman encoding and decompress blocks of data that are compressed with variable-length Huffman encoding. Other compression schemes that comprise compressors and decompressors which implement other compression and decompression algorithms, such as delta-based, pattern-based, etc. can be also used.

Compression schemes like the aforementioned ones add inevitably latency and complexity due to the processes of compression and decompression. Compression and decompression are in the critical memory access path when compression is applied in the aforementioned cache or/and memory subsystems of an example computer system. Compression and decompression can also increase the transmission latency when compression and decompression are applied to the data transferring subsystem in a computer system or in a communication network.

Data are accessed and processed in chunks of particular sizes depending on the data types forming data values. Data values of certain data types exhibit often certain value locality properties. Prior art compression schemes try to exploit this by making a priori assumptions on what data types are the root cause of value locality to simplify the compression and decompression processes and keep compression and decompression latency low.

Value locality comprises two main notions: a) temporal value locality and b) spatial (or clustered) value locality. Temporal value locality stipulates that the same value appears often. Statistical compression algorithms are example compression algorithms that take advantage of this value locality notion. On the other hand, spatial value locality stipulates that values are numerically similar. Delta encoding is an example compression algorithm that exploits spatial value locality as it is meaningful to encode such values with their difference to a base value. Temporal value locality comprises also specific cases: i) zero-value locality: for example, in the cache subsystem and/or memory subsystem and/or data transferring subsystem in a computer system a data block may contain data values which are all zero values (referred to as null block data type), as depicted on the left of FIG. 13 and FIG. 14; ii) narrow-value locality: for example, when values in data block are narrow unsigned integer values, which belong to the range 0-255 but they need to be represented with 32 bits, all of them have 0 bits in their 24 most significant bits (referred to as narrow-value data type). Narrow value locality is exploited by Significance-based compression algorithms or pattern-based compression algorithms.

Statistical compression schemes can be considered a reasonable default strategy. However they do not always result in the highest compressibility. For example, integers that are moderately common are replaced by longer codewords than the most common ones using statistical compression schemes. If said integers are also spatially close, they can potentially be coded much denser using delta encoding instead. As data values in a data block are of different data types and/or exhibit different value locality properties, robustness in compressibility cannot be guaranteed as there is no compression scheme that can always perform better than others for various data types. The present inventors have realized that there is room for improvements in the technical field of data compression and decompression.

SUMMARY OF THE DISCLOSURE

It is an object of the invention to offer improvements in the technical field of data compression and decompression.

This disclosure generally discloses methods, devices and systems for compressing a data block of data values and decompressing a compressed data block of data values, when compression is applied to for instance the cache subsystem and/or memory subsystem and/or data transferring subsystem in a computer system and/or a data communication system. There are various methods, devices and systems to compress data effectively in said subsystems, which in order to simplify their design and reduce their compression and decompression latency, they make design-time assumptions about certain data type(s) as the root cause of value locality. However, as a data block comprises a plurality of values which can be of a plurality of data types, robust compressibility cannot be guaranteed as one compression method is not always the best. Methods, devices and systems enhance compression and decompression of data blocks of data values by combining two or a plurality of compression methods and devices together, which said compression methods and devices compress effectively data values of particular data types. According to a first concept of the present invention disclosure, hybrid data compression methods, devices and systems combine a plurality of compression methods and devices; wherein hybrid data compression methods, devices and systems select the best suited compression method and device using as a main selection criterion the dominating data type of an input data block; wherein data types are predicted by a prediction method and device. According to a second inventive concept of the present invention disclosure, hybrid data compression methods, devices and systems combine two compression methods and devices: one that compress effectively data blocks using for example variable-length encoding and another that compress data blocks that comprise a plurality of the same common value with only one bit. According to a third inventive concept of the present invention disclosure a prediction method (and device) with high accuracy is presented; said prediction method (and device) predicts the best suited compression method (and device) for compressing an input block at runtime using as a main selection criterion the predicted dominating data type of said block. Said prediction method (and device) comprises two phases; wherein first phase it divides a data block into a plurality of segments and for each segment it inspects particular bit-portions to predict its data type; wherein second phase, the outcome of first phase is evaluated in some order to decide the best suited compression method (and device). According to a fourth inventive concept, predicted compression methods (and devices) can be adjusted at runtime if prediction is found to be inaccurate using as a reference an oracle selection.

A first aspect of the present invention is a hybrid data compression device for compressing an uncompressed data block into a compressed data block, the uncompressed data block comprising one or a plurality of data values of one or a plurality of data types, the hybrid data compression device comprising: a plurality of data compressors, each compressor being configured for a respective data compression scheme; and a predictor mechanism configured for predicting data types of data values of the uncompressed data block and for selecting an estimated best suited data compressor among said plurality of data compressors using as main criterion a dominating data type among the predicted data types, wherein the hybrid data compression device is configured to generate the compressed data block by causing the selected estimated best suited data compressor to compress the whole of the uncompressed data block.

A second aspect of the present invention is a hybrid data compression method for compressing an uncompressed data block into a compressed data block, the uncompressed data block comprising one or a plurality of data values of one or a plurality of data types, the hybrid data compression method comprising: predicting data types of data values of the uncompressed data block; selecting an estimated best suited data compression scheme among a plurality of data compression schemes using as main criterion a dominating data type among the predicted data types, and compressing the whole of the uncompressed data block by the selected estimated best suited data compression scheme to generate the compressed data block.

A third aspect of the present invention is a hybrid data decompression device for decompressing a compressed data block into a decompressed data block comprising one or a plurality of data values of one or a plurality of data types, the hybrid data decompression device comprising: a plurality of data decompressors, each decompressor being configured for a respective data decompression scheme, wherein the hybrid data decompression device is configured to generate the decompressed data block by causing a selected estimated best suited data decompressor among said plurality of data decompressors to decompress the whole of the compressed data block.

A fourth aspect of the present invention is a hybrid data decompression method for decompressing a compressed data block into a decompressed data block comprising one or a plurality of data values of one or a plurality of data types, the hybrid data decompression method comprising: selecting an estimated best suited data decompression scheme among said plurality of data decompression schemes; and decompressing the whole of the compressed data block by the selected estimated best suited data compression scheme to generate the decompressed data block.

A fifth aspect of the present invention is a computer program product comprising code instructions which, when loaded and executed by a processing device, cause performance of the method according to the second aspect above.

A sixth aspect of the present invention is a device comprising logic circuitry configured to perform the method according to the second aspect above.

A seventh aspect of the present invention is a computer program product comprising code instructions which, when loaded and executed by a processing device, cause performance of the method according to the fourth aspect above.

An eighth aspect of the present invention is a device comprising logic circuitry configured to perform the method according to the fourth aspect above.

A ninth aspect of the present invention is system comprising one or more memories, a data compression device according to the first aspect above and a data decompression device according to the third aspect above.

Other aspects, objectives, features and advantages of the disclosed embodiments will appear from the following detailed disclosure, from the attached dependent claims as well as from the drawings. Generally, all terms used in the claims are to be interpreted according to their ordinary meaning in the technical field, unless explicitly defined otherwise herein.

All references to "a/an/the [element, device, component, means, step, etc]" are to be interpreted openly as referring to at least one instance of the element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

Examples from the background art as well as embodiments of inventive aspects are described with respect to the following figures:

FIG. 29 is a schematic flow chart illustrating a general hybrid data decompression method according to the invention.

DETAILED DESCRIPTION

The present disclosure discloses hybrid data compression methods, devices and systems for compressing one or a plurality of data blocks of data values and decompressing one or a plurality of compressed data blocks of data values, when compression is applied to the cache subsystem and/or memory subsystem and/or data transferring subsystem in a computer system and/or a data communication system. Each said data block can be of arbitrary size and comprises one or a plurality of data values that are of one or a plurality of certain data type(s). The methods, devices and systems disclosed in this document select the estimated best suited data compression scheme among two or a plurality of compression schemes using as main criterion the dominating data type in said data block and apply said scheme to said data block; said data block is characterized of said dominating data type by predicting the data types of the data values within said block using a predictor disclosed by said methods, devices and systems.

Figure 1:
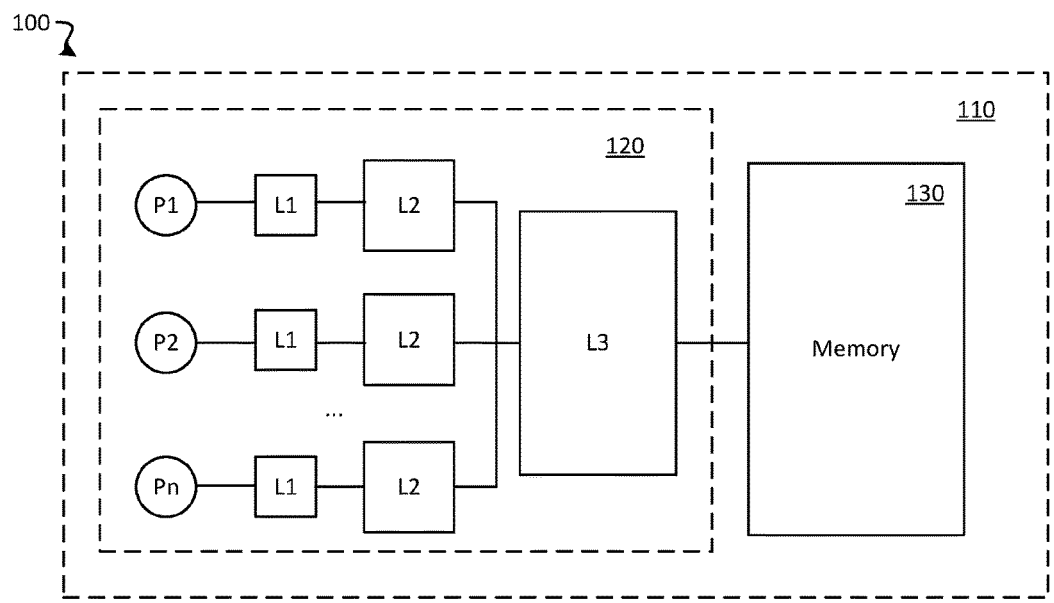
FIG. 1 illustrates a block diagram of a computer system that comprises n processing cores, each one connected to a cache hierarchy of three levels and the main memory.
Figure 6:
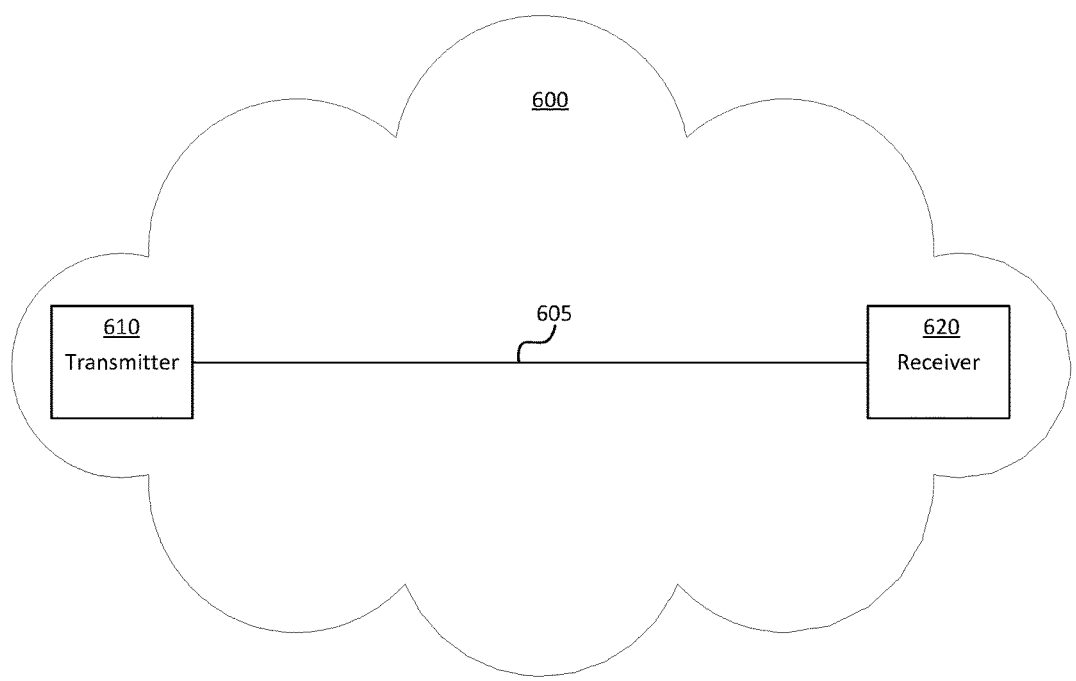
FIG. 6 illustrates a block diagram of a data transmission link that connects two points in a communication network. These points can be two intermediate nodes in the network or the source and destination nodes of a communication link or a combination of these cases.

A data block can be of arbitrary size and comprises one or a plurality of data values that are of one or a plurality of data types. In the embodiment of a computer system, as depicted in FIG. 1, a block of data values can be alternatively referred to as 1) a cache line, a cache set, a cache sector or similarly when the block of data is saved in the cache hierarchy, 2) as a cache line, a memory page, a memory sector or similarly when the block of data is saved in the memory or transferred in the communication means within such computer system. On the other hand, in the embodiment of a transmission link within a communication network as depicted in FIG. 6, a block of data may also refer to packet, flit, payload, header or similar or can be a smaller part of these.

The plurality of possible said data types, which can be encountered in said data block, include standard types such as integers, pointers, floating-point numbers, characters, strings and boolean values. The plurality of possible said data types include also non-standard types, which are though special cases of said standard data types as described in the background of the present document and are very common in the cache subsystem and/or memory subsystem and/or data transferring subsystem in a computer system and/or a communication network. Such an example non-standard type is the null block data type. Other data types are also possible in addition or as alternatives to one or more of these exemplifying data types, including but not limited to code instructions, and data types which follow specific formats or standards (e.g. video, audio).

What will follow now in this disclosure is a description of certain embodiments of data compression devices and data decompression devices, and associated methods, according to the inventive aspects. This description will be made with particular reference to FIG. 13-FIG. 27 and FIG. 30. Then, this disclosure will present general inventive aspects, generalized over the specific embodiments shown in FIG.

Figure 27:
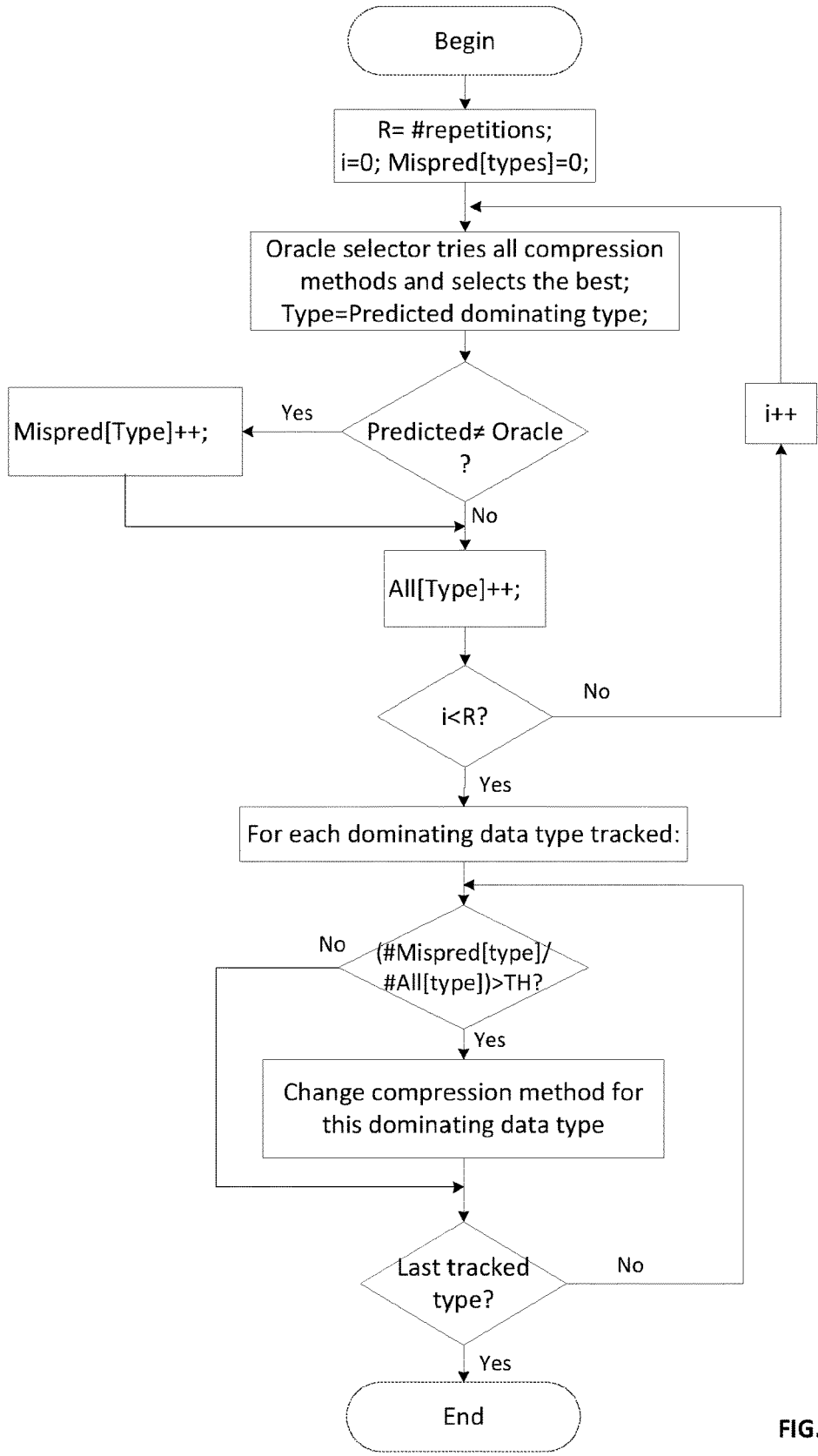
FIG. 27 illustrates an exemplary flow chart of a method that during a defined time-window it tracks the accuracy of the prediction method by comparing the predicted compression methods with the ideally selected compression methods (yielded by an oracle selector) for a plurality of dominating data types tracked. After said time-window, it compares said accuracy to certain thresholds in order to decide whether predicted compression method should be adjusted based on ideal selection from that point and onwards.
Figure 30:
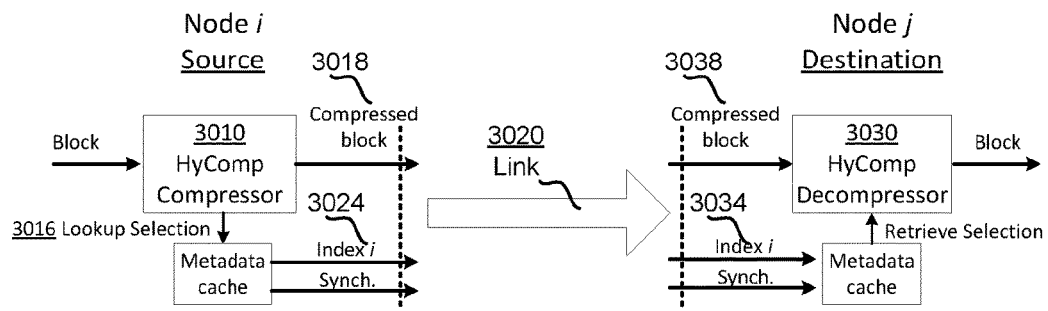
FIG. 30 illustrates an example embodiment of a link subsystem, in which the hybrid data compression methods, devices and systems as described herein may be applied and in which one end of the link acts as a source (transmitter) and the other end of the link acts as a destination (receiver).

13-FIG. 27 and FIG. 30. These general inventive aspects will be described with some reference to FIG. 28, FIG. 29 and FIG. 31.

Figure 8:
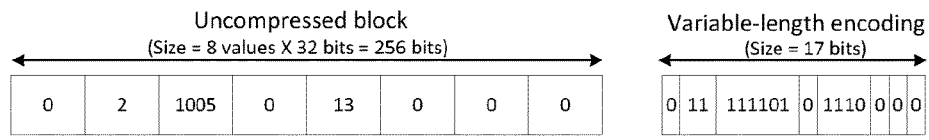
FIG. 8 illustrates on the left an uncompressed block of data values and, on the right, the same block in compressed form using variable-length encoding that has been generated using Huffman coding. All the data values of the uncompressed block are replaced by the respective Huffman codewords.
Figure 13:
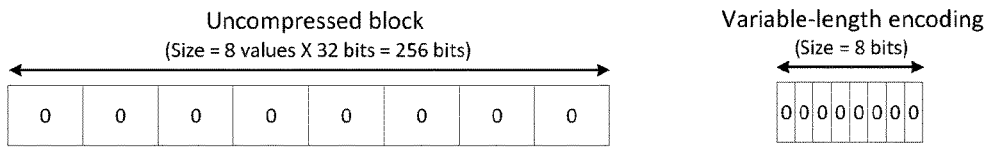
FIG. 13 shows on the left a null uncompressed block, which is a block that contains only zero data values, and on the right the same block compressed with the compressor of FIG. 9, using variable-length encoding assuming that each zero value is replaced by a codeword of the minimum possible width (1 bit).
Figure 14:
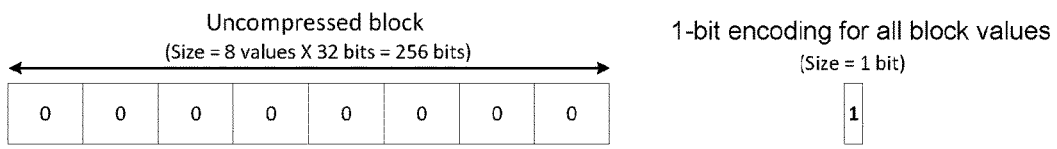
FIG. 14 shows on the left a null uncompressed block, which is a block that contains only zero data values, and on the right the same block compressed using a 1-bit encoding.
Figure 15:
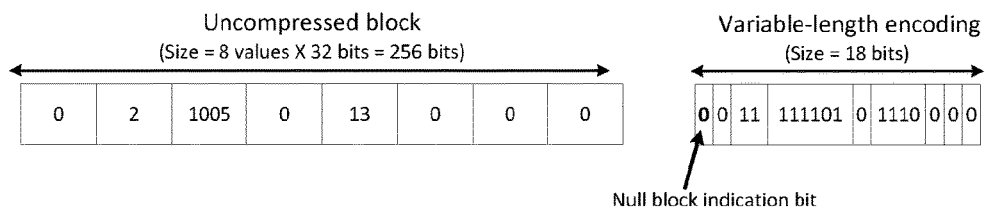
FIG. 15 shows on the left an uncompressed block, which is the same block as in FIG. 8, and on the right the same block in compressed form in an alternative way comprising a one bit indicator, which indicates whether the compressed block is null or not, and a variable-length encoded bit sequence.

Assuming first that an example hybrid data compression method (or device) comprises two compression schemes: a Huffman-based statistical compression scheme and Null-block compression scheme. The Huffman-based statistical compression scheme can compress effectively data blocks that comprise values, which are of any type that exhibit high temporal value locality. An example such type is the integer numbers. FIG. 8, on the left, shows an example of said block that comprises 8 data values, while on the right of FIG. 8 the same block appears compressed using a Huffman-based compression scheme assuming an example Huffman encoding. FIG. 13, on the other hand, depicts on the left an uncompressed Null data block, which is a block that comprises zero values only. A Huffman-based compression scheme can also compress such a block. Assuming that a zero value is represented by the smallest possible Huffman codeword (i.e., 1 bit), a compressed Null block comprises 8 bits as is shown on the right of FIG. 13, as variable-length coding such as Huffman coding is bounded to a maximum compression ratio, as one codeword can only replace in the best case a data value. On the other hand, a Null-block compression scheme can compress a Null data block by only 1 bit as shown on right of FIG. 14. However, a Null-block compression scheme cannot compress other blocks than Null blocks. Therefore, a hybrid data compression method that comprises a Huffman-based statistical compression scheme and a Null-block compression scheme can offer maximum compressibility by selecting the best suited scheme among those two, based on whether the dominating type is Null block or other types. The predictor of said hybrid data compression method must be able to identify whether all the values of an input data block are dominated by the value zero so that the data block is characterized as Null block and is compressed by the Null block compression scheme; otherwise the input data block is compressed by the Huffman-based compression scheme. It is also possible that the input data block cannot be compressed or is expanded instead of being compressed; in this case it can be selected to remain uncompressed.

Figure 9:
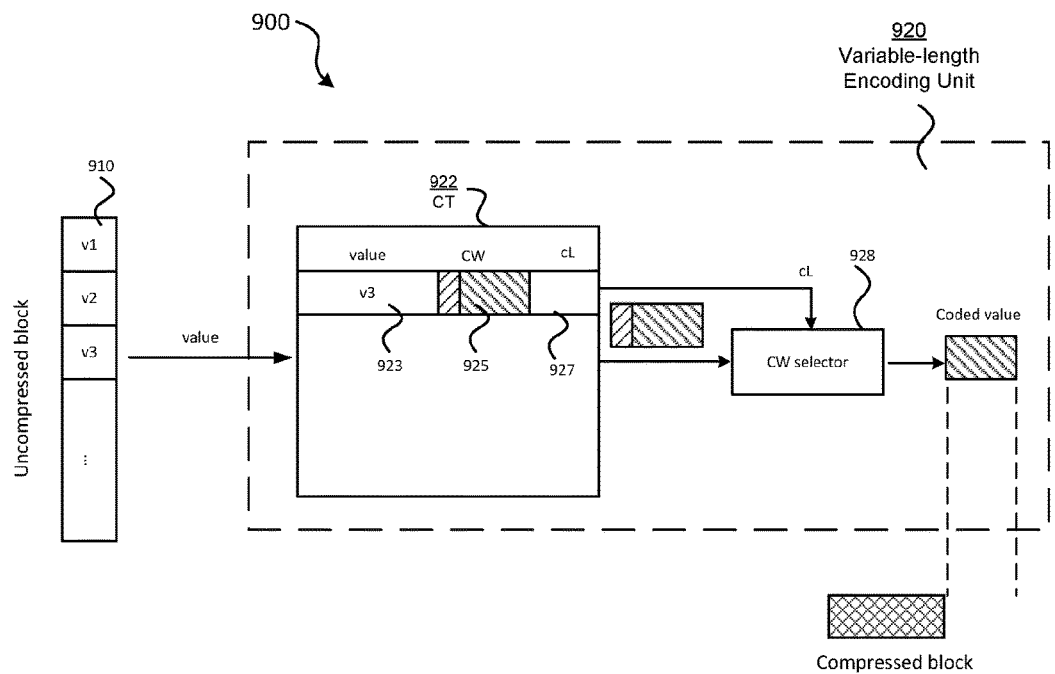
FIG. 9 illustrates a compressor that is used to compress (or encode) blocks using Huffman encoding, as illustrated in FIG. 8.
Figure 16:
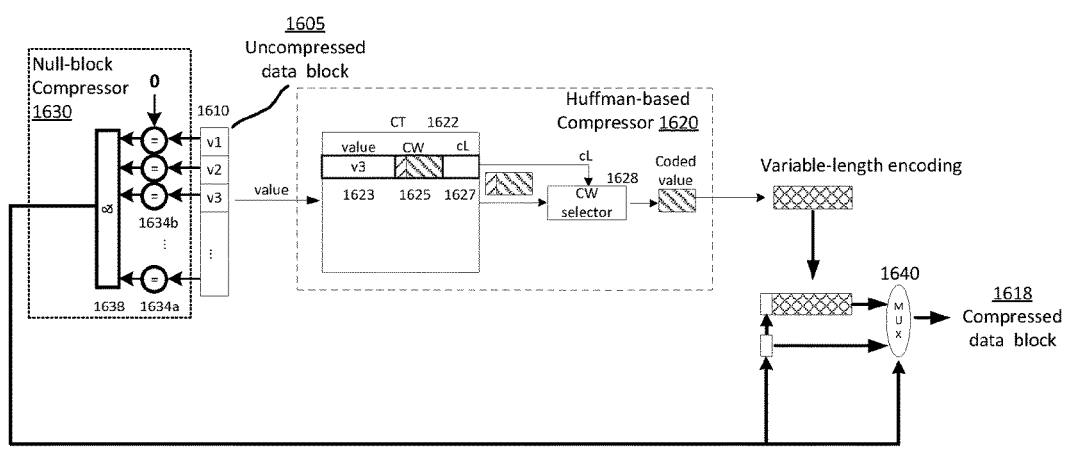
FIG. 16 illustrates a hybrid data compression device that is able to compress the uncompressed blocks of FIG. 14 (compressed null block) and FIG. 15 (compressed block that comprises a bit indicator and variable-length codewords), comprising the Huffman-based compression device of FIG. 9 and a Null block compression device. The hybrid data compression device uses the Null block compression device to check whether all the block data values are zero values and compresses it with a 1-bit encoding as in FIG. 14; otherwise, it compresses it with the Huffman-based compression device as in FIG. 15.

The data compression device embodiment of said example hybrid data compression method is depicted in FIG. 16. It comprises: a unit 1610, which can be a storage unit or an extractor of data values out from an input uncompressed data block 1605; a second data compressor 1620 of a Huffman-based statistical compression scheme which is similar to the Variable-length Encoding Unit 920 of FIG. 9; and a first data compressor (Null-block Compressor) 1630. The Null-block compressor 1630 checks using the comparators 1634a, b, c and logic 1638, whether the data values of the input uncompressed data block 1605 are all zero values. If it is true, then the 1-bit output is '1'; otherwise, it is '0'. For this example hybrid data compression method embodiment, the Null-block Compressor also stands for the dominating-type predictor of each incoming data block, as the compressor exactly like the predictor needs to identify whether the whole data block comprises zero data values. If the output of the Null block compressor 1630 is '1', then the outcome of the prediction is that the input uncompressed data block 1605 is classified as a Null block and is compressed with 1 bit. Otherwise, it is classified as a block compressible by the Huffman-based compressor 1620 and the compressed block comprises the variable-length encoding (output from the Huffman-based compressor 1620) preceded by a '0' bit (indicates that is a non-null compressed block). An example embodiment of said compressed data block 1618 is depicted at the right-hand side of FIG. 15. The block's type-characterization is used to control the selection (by the selector 1640) of the appropriate compressed block for the output of the compressor embodiment of the hybrid data compression method. Other alternative implementations of this compressor can be realized by someone skilled in the art.

Figure 10:
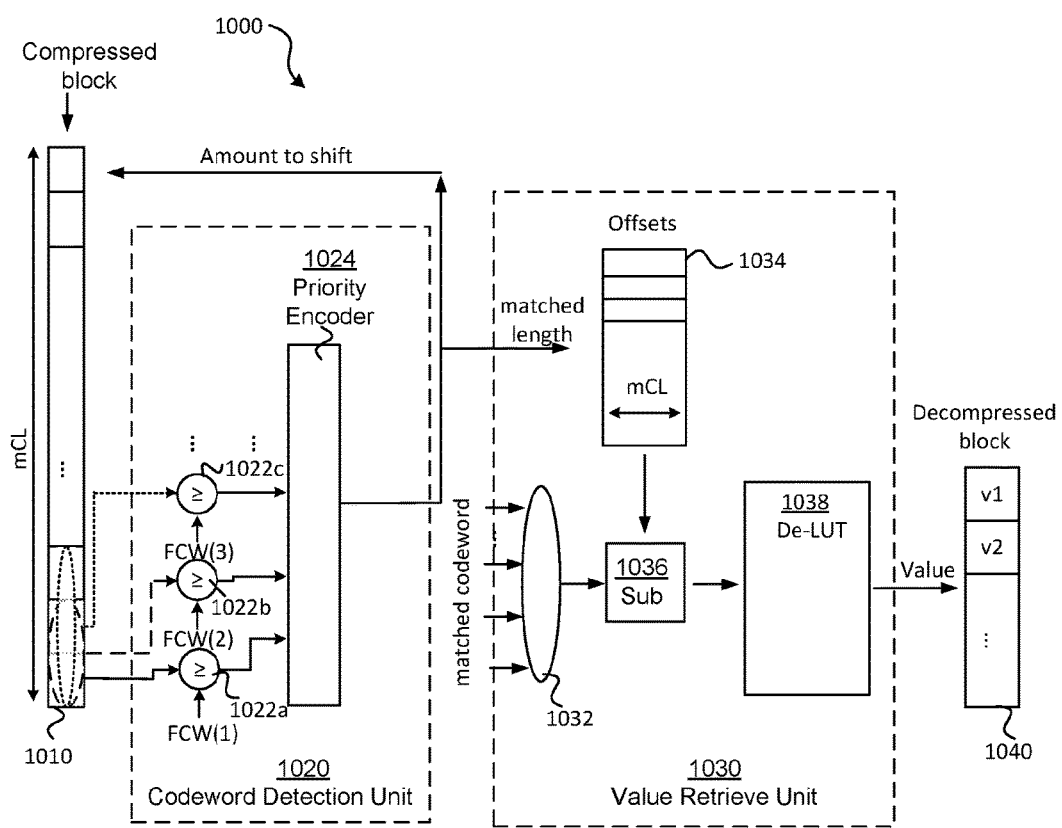
FIG. 10 illustrates a decompressor that is used to decode (or decompress) blocks that were compressed using canonical Huffman encoding.
Figure 11:
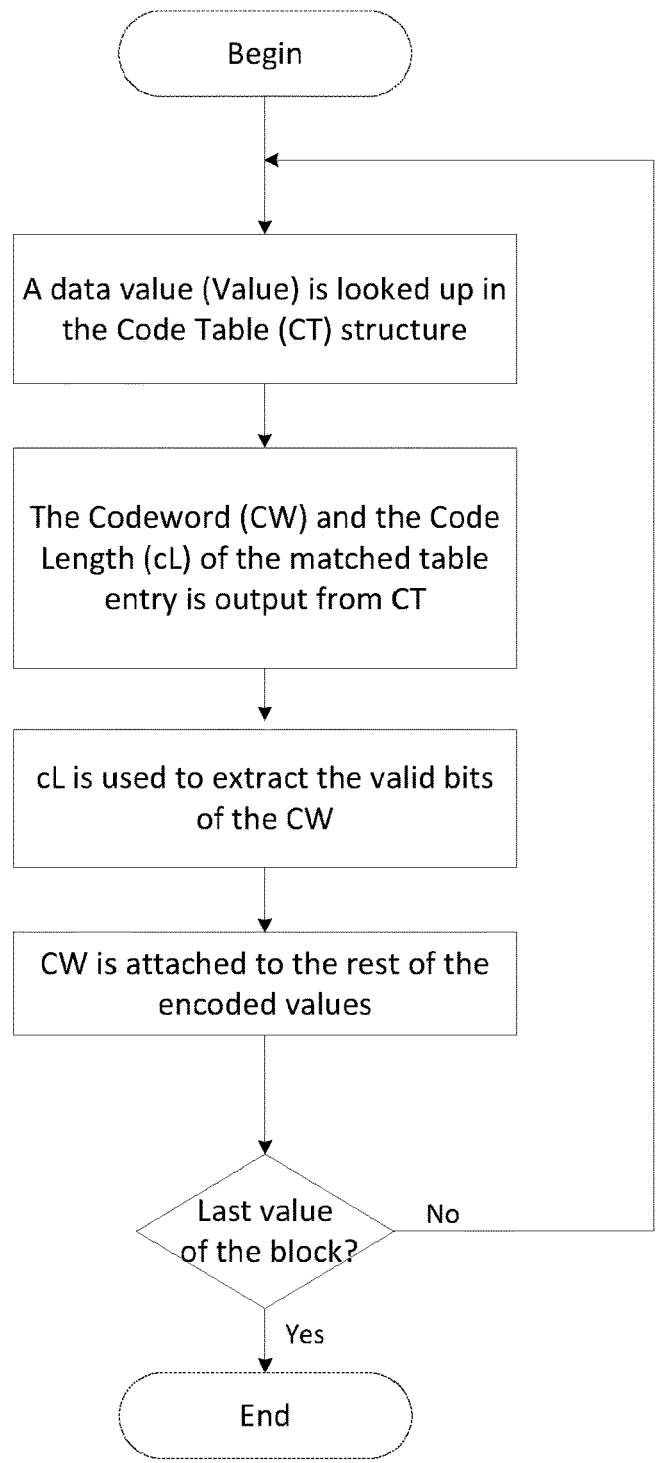
FIG. 11 illustrates an exemplary flow chart of a compression method for compressing a block using variable-length encoding (e.g., Huffman).
Figure 12:
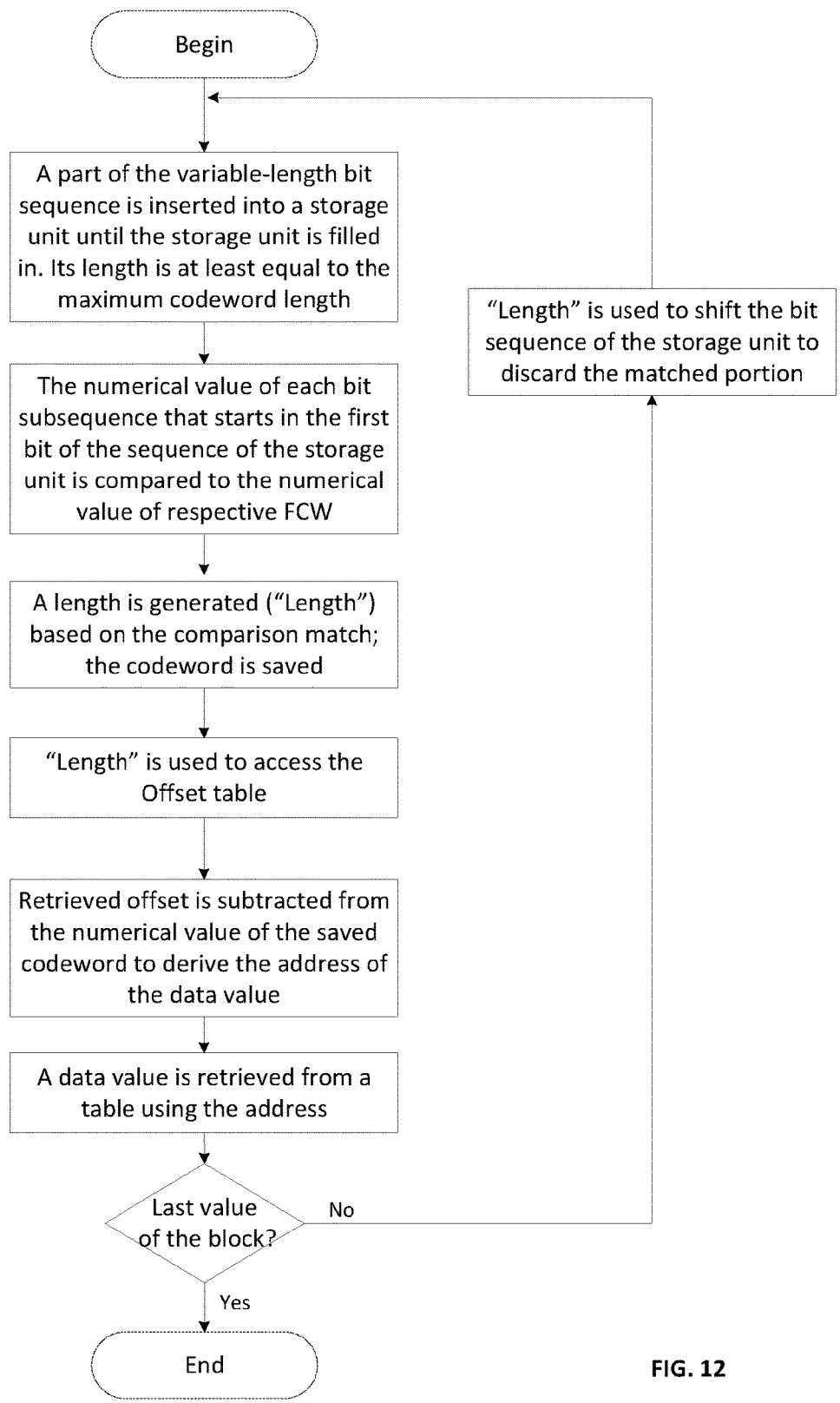
FIG. 12 illustrates an exemplary flow chart of a decompression method for decompressing a compressed block that is compressed using variable-length encoding (e.g., canonical Huffman).
Figure 17A:
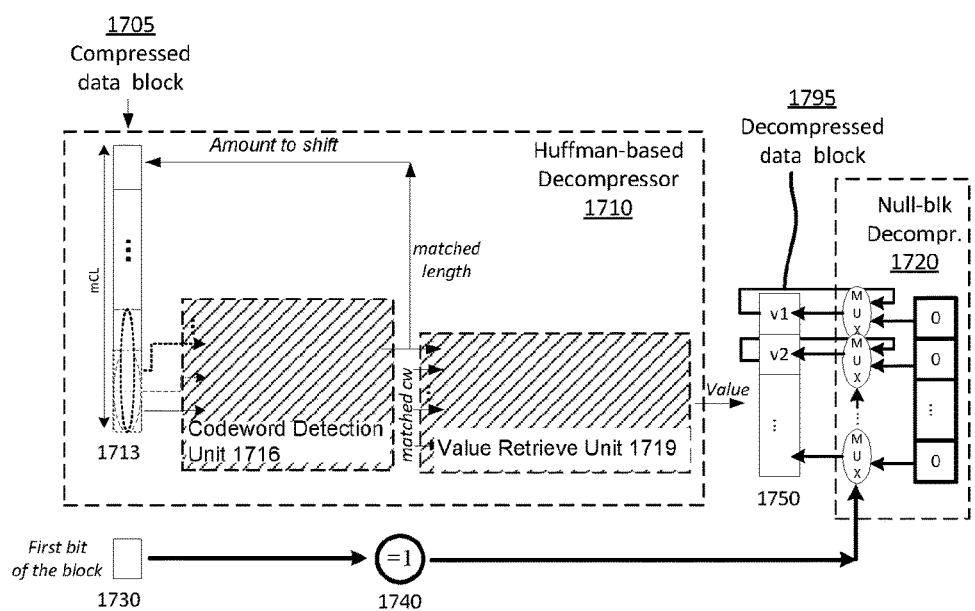
FIG. 17a illustrates a hybrid data decompression device that is able to decompress the compressed blocks of FIG. 14 (compressed null block) and FIG. 15 (compressed block that comprises a bit indicator and variable-length codewords), comprising the data decompression device of FIG. 10, the Null block decompression device and extra logic (on the bottom of FIG. 17a) that is able to detect whether the block is compressed as a null block by checking whether the first bit of the block is one.

The data decompression device embodiment of said example hybrid data compression method is depicted in FIG. 17a. It comprises a Huffman-based second data decompressor 1710, which is similar to the decompressor of FIG. 10, a first data decompressor (Null-block Decompressor) 1720 and extra logic; said extra logic comprises a register (e.g., flip-flop) 1730, a comparator 1740 and a storage unit for 1750 for the decompressed data block 1795. The data decompression device of the example hybrid data compression method compares the first bit of the input compressed data block 1705 (the first bit being kept in a register 1730) with '1' using the comparator 1740 to check whether the input compressed block is a compressed null block. In this case, the data values of the decompressed block 1750 are initialized to the value 0 using the Null block decompressor 1720, which further comprises selectors that are controlled by said comparison's output and select the value 0. On the other hand, if the register 1730 saves the bit '0', which indicates that the input compressed block is a non-null compressed block, the Huffman-based decompressor 1710 decompresses said input compressed data block 1705 as described in the background of the present document.

Figure 17B:
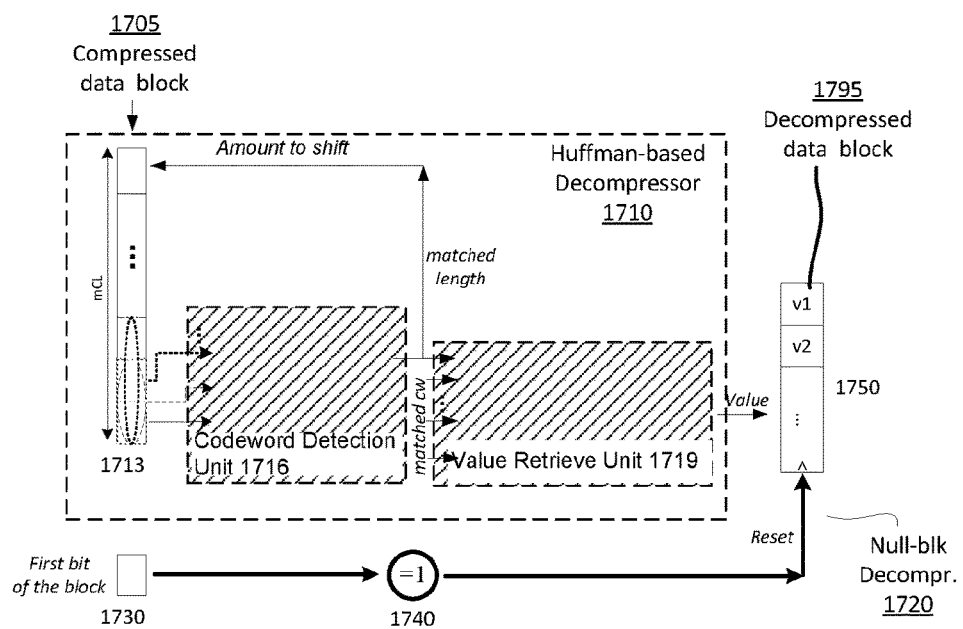
FIG. 17b illustrates a hybrid data decompression device that is able to decompress the compressed blocks of FIG. 14 (compressed null block) and FIG. 15 (compressed block that comprises a bit indicator and variable-length codewords), comprising the data decompression device of FIG. 10, an alternative embodiment of the Null block decompression device and extra logic (on the bottom of FIG. 17b) that is able to detect whether the block is compressed as a null block by checking whether the first bit of the block is one.

An alternative embodiment of a data decompression device of said example hybrid data compression method is depicted in FIG. 17b and contains a more simplified version of the Null-block decompressor 1720. The decompressed data block 1795 is kept in the storage unit 1750 such as an array of flip-flops, which can be reset to the value 0 (i.e., Null-block decompressor) if the storage unit's 1750 input reset signal is set to '1'. The reset signal is connected to the output of the comparator 1740, which indeed outputs '1' when the first bit of the input compressed data block 1705 is '1' which constitutes a compressed null-block. Other alternative implementations of this data decompression device can be realized by someone skilled in the art.

Alternative embodiments of the data decompression device and data decompression device of said hybrid data compression method can be realized by someone skilled in the art using other lossless compression schemes instead of the variable-length Huffman compression scheme. Furthermore, alternative embodiments of said hybrid data compression method that include another compression scheme similar to the null-block compression scheme but where the replicated value across the whole block is not the value 0 but instead another specific common value, can be realized by someone skilled in the art.

The previous embodiment is a simplified hybrid data compression method, which contains only two compression schemes and distinguishes only between Null blocks and blocks of other types. However, data of various types are accessed in the cache/memory subsystems of a computer system or transferred within a computer system depending on the running application(s) and data of various types are transferred in a data communication system depending on the domain of the transferred data set.

Figure 18:
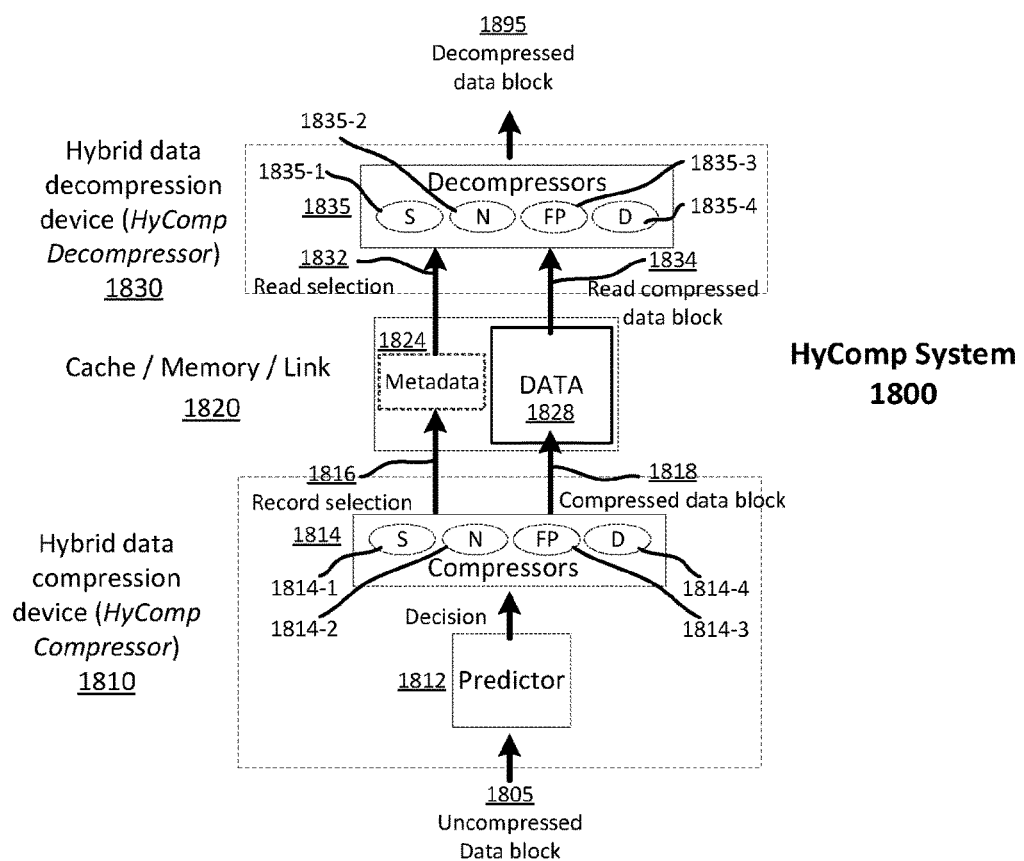
FIG. 18 illustrates an embodiment of a hybrid data compression system, which integrates a plurality of compression and decompression devices into a cache/memory/link subsystem of a computer system or a transmission link in a communication network, and it is referred to as HyComp, comprising the HyComp compression device, the HyComp decompression device and the target cache/memory/link example subsystem; wherein the HyComp compression device comprises a set of compression devices and a predictor that predicts the best suited compression device for a given block of data values.

The block diagram of FIG. 18 depicts an embodiment of a hybrid data compression system 1800, which integrates more than two compression schemes into a cache/memory/link subsystem of a computer system or a transmission link in a data communication system, and it is referred to as HyComp. The HyComp system 1800 comprises a data compression device (HyComp Compressor) 1810, a data decompression device (HyComp Decompressor 1830) and a target cache/memory/link example subsystem 1820. When HyComp is integrated into a cach/memory subsystem, both HyComp Compressor and HyComp Decompressor are connected to said subsystem. On the other hand, when HyComp is integrated into a link subsystem (either in a computer system or in a data communication system), the HyComp Compressor is integrated into the transmitter and the HyComp Decompressor into the receiver. If each end of a link comprises both a transmitter and receiver, then both HyComp Compressor and Decompressor are integrated into each end.

The HyComp Compressor 1810 compresses an uncompressed data block 1805 inserted to the target subsystem (cache/memory/link) by making a data-type prediction in a Predictor 1812. Using as main criterion the predicted dominating data type within said data block 1805, the Predictor 1812 selects the one expected to provide the best compressibility among a plurality of data compression schemes 1814-1, 1814-2, 1814-3, 1814-4 (data compressors 1814) to compress said data block 1805. The compressed data block 1818 is then inserted in a Data part 1828 of the target subsystem 1820, while the data compression scheme selected is recorded, 1816, as metadata in a metadata part 1824 of the target subsystem 1820. In one embodiment, the metadata can be saved or transmitted separately from the actual compressed data; in another embodiment metadata can be concatenated to the compressed data. Conversely, the HyComp Decompressor 1830 simply decompresses a compressed data block 1834 by selecting one out of a plurality of data decompression schemes 1835-1, 1835-2, 1835-3, 1835-4 of a respective plurality of data decompressors 1835, based on the recorded selected compression scheme that is stored or transmitted as metadata 1824. Hence, the HyComp system 1800 may extend the latency of compression due to the prediction in comparison to a single compression scheme; however decompression will be as fast as using a single compression scheme. This is important when the target subsystem is for example cache/memory, because it is especially decompression that lies into the critical memory access path rather than compression.

In said example embodiment 1800 of the HyComp system, the specific compression schemes 'S', 'N', 'D', and 'FP' in FIG. 18) are selected because they compress efficiently data of certain common data types. The data types considered in this embodiment are integers, pointers, 64-bit precision floating-point numbers and the null block non-standard data type. The association between said data types and compression schemes is as follows:

Integers: Integers are associated with Statistical compression schemes (denoted as 'S' in FIG. 18). This is because such schemes assign denser codes to more frequently used integers than other schemes by using variable-length encoding.

Pointers: Pointers are associated with delta compression schemes (denoted as 'D' in FIG. 18). This is because pointers typically exhibit spatial value locality, meaning that values differ by a small amount that can be efficiently encoded as deltas to a base value.

Floating-point numbers: Floating-point numbers are associated with a specific compression scheme (denoted as 'FP' in FIG. 18) that is specialized to effectively compress floating-point data. An example FP compression method is disclosed in the patent application METHODS, DEVICES AND SYSTEMS FOR SEMANTIC-VALUE DATA COMPRESSION AND DECOMPRESSION, which is filed concurrently with the present patent application, which shares the same applicant and inventors, the contents of which are incorporated herein in its entirety by reference, and which encodes (compresses) the semantically meaningful data values of each floating-point number in isolation, after further splitting the mantissa into two or a plurality of subfields to increase the value locality exhibited.

Null blocks: Null blocks are associated with the null block compression scheme (denoted as 'N' in FIG. 18), which encodes said blocks with only a single bit. A null-block variation that is common and also included is when the block comprises negative-signed zero floating-point values. We refer to such a block as negative null block.

A data block comprises data values of various data types; compressing each data value with a specific compression scheme based on its data-type would yield optimal compressibility. However, this would increase the amount of metadata substantially in order to "know" the selected compression scheme for the decompression later; this would also complicate and slow down the process of decompression as different schemes need to be used in combination for the decompression of one block. The hybrid data compression methods, devices and systems disclosed in this disclosure apply a compression scheme to the whole uncompressed data block. The selection of the appropriate compression scheme is done by a predictor mechanism, like the Predictor 1812 of the HyComp compressor 1810 as depicted in FIG. 18, using as main criterion the dominating data type of the data values of said uncompressed data block.

Said Predictor 1812 of the HyComp system of FIG. 18 implements a prediction method. An embodiment of such a prediction method comprises 2 phases, as also shown by an exemplary flow chart in FIG. 19:

Phase-I (Inspection): The uncompressed data block is divided into segments. A particular bit-portion of each segment (referred to as Inspection Portion—IP) is inspected to speculate on the data type of the segment for all said segments and count the occurrences of each predicted data type within said block. The segment can be selected to have the same granularity as a data value; however, as a data block comprises values of different granularities (mostly depends on the data type), phase-I can be simplified by processing on data of the same granularity (e.g., 64-bit segments).

Phase-II (Decision): Based on the type-characterization of the individual segments from Phase-I, the best suited compression scheme is selected for the block mainly based on the dominating data type. The selected compression scheme is applied to all segments of said block.

Figure 20:
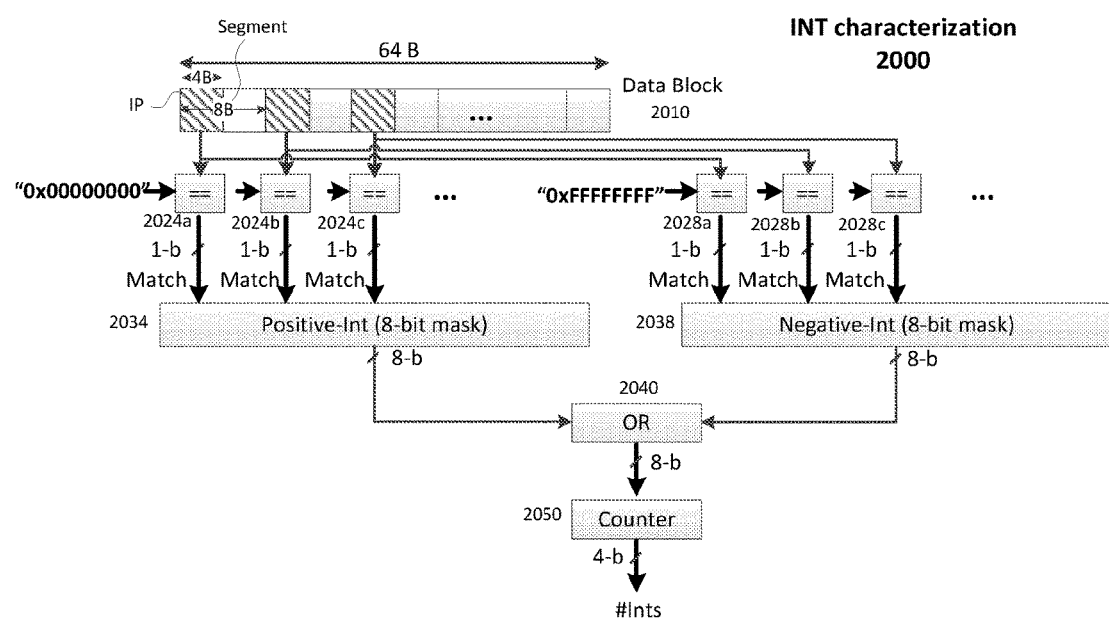
FIG. 20 illustrates an example embodiment of the inspection phase of the prediction method of FIG. 19 targeting to characterize integer data types within a data block.

In said prediction method that is used by the embodiment of the HyComp system applied in the cache/memory/link subsystem of a computer system as shown in FIG. 18, the data block is 64 bytes (i.e., typical size in today's computer systems) and the segment size is selected to be 8 bytes (i.e., 8 segments per block). The size (width) of each Inspection Portion (IP) depends on the data types being predicted. In Phase-I of said prediction method, the data-type characterization is executed as follows:

Integers: The IP is the 4 most significant bytes of a segment. If the IP is either 0x00000000 (i.e., positive integer) or 0xFFFFFFFF (i.e., negative integer), the segment is characterized as an integer and the respective counter (#Int) is incremented. The block diagram of FIG. 20 illustrates an example embodiment of the inspection process targeting to characterize integer data types within a data block 2010. The comparison to 0x00000000 takes place in the comparators 2024a, b, c, etc and to 0xFFFFFFFF in the comparators 2028a, b, c, etc. The comparison outcomes (e.g., '1' for a match) are marked in the masks 2034 and 2038. The mask comprises as many bits as the number of segments. The union of the two masks is taken (the masks are combined with logic, i.e., an OR gate 2040) and the counter 2050 counts the number of '1's, which is the number of the characterized integers (i.e., #Int count).

Figure 21:
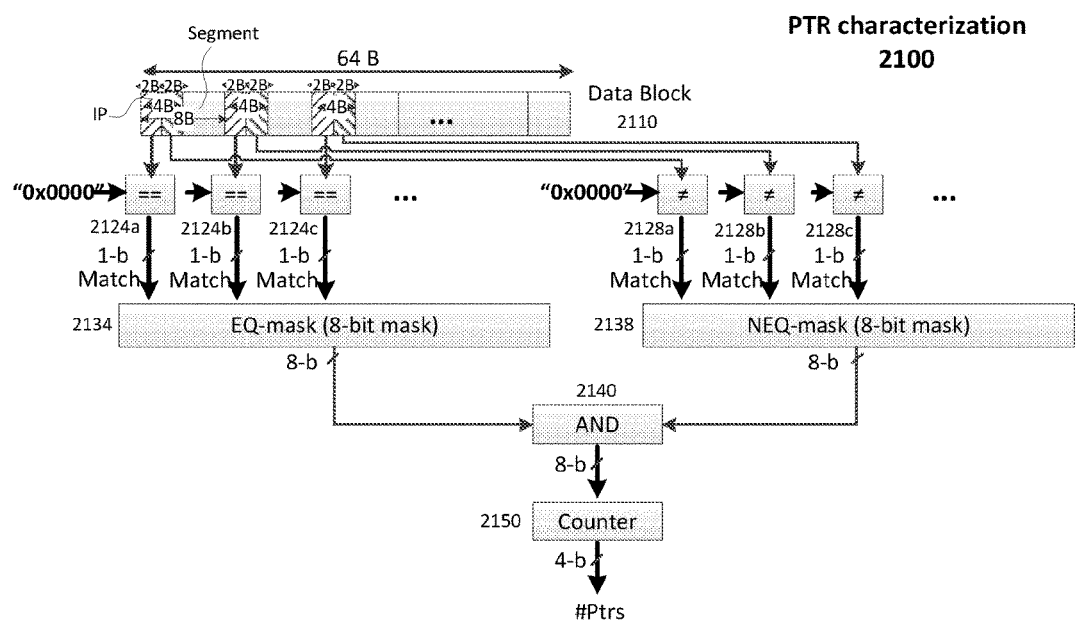
FIG. 21 illustrates an example embodiment of the inspection phase of the prediction method of FIG. 19 targeting to characterize pointer data types within a data block.

Pointers: The IP is the 4 most significant bytes of a segment. If the two most significant bytes of the IP are equal to 0x0000 and the two least significant bytes of the IP are not equal to 0x0000, then the segment is characterized as a pointer and the respective counter (#Ptr) is incremented. The rationale behind inspecting the 4 most significant bytes in said specific way is to detect 48-bit pointers; such example width is used by addresses in the cache/memory subsystem of today's computer systems. One limitation of said inspection policy is that small pointers are characterized as integers instead of pointers. The block diagram of FIG. 21 illustrates an example embodiment of the inspection process targeting to characterize pointer data types within a data block 2110. The comparison to 0x0000 takes place in the comparators 2124a, b, c, etc and the inequality comparison to 0x0000 in the comparators 2128a, b, c, etc. The comparison outcomes (e.g., '1' for a match) are marked in the masks 2134 and 2138. The mask comprises as many bits as the number of segments. The intersection of the two masks is taken (the two masks are combined with logic, i.e., an AND gate 2140 because both conditions must hold) and the counter 2150 counts the number of '1's, which is the number of characterized pointers (i.e., #Ptr count).

Figure 22:
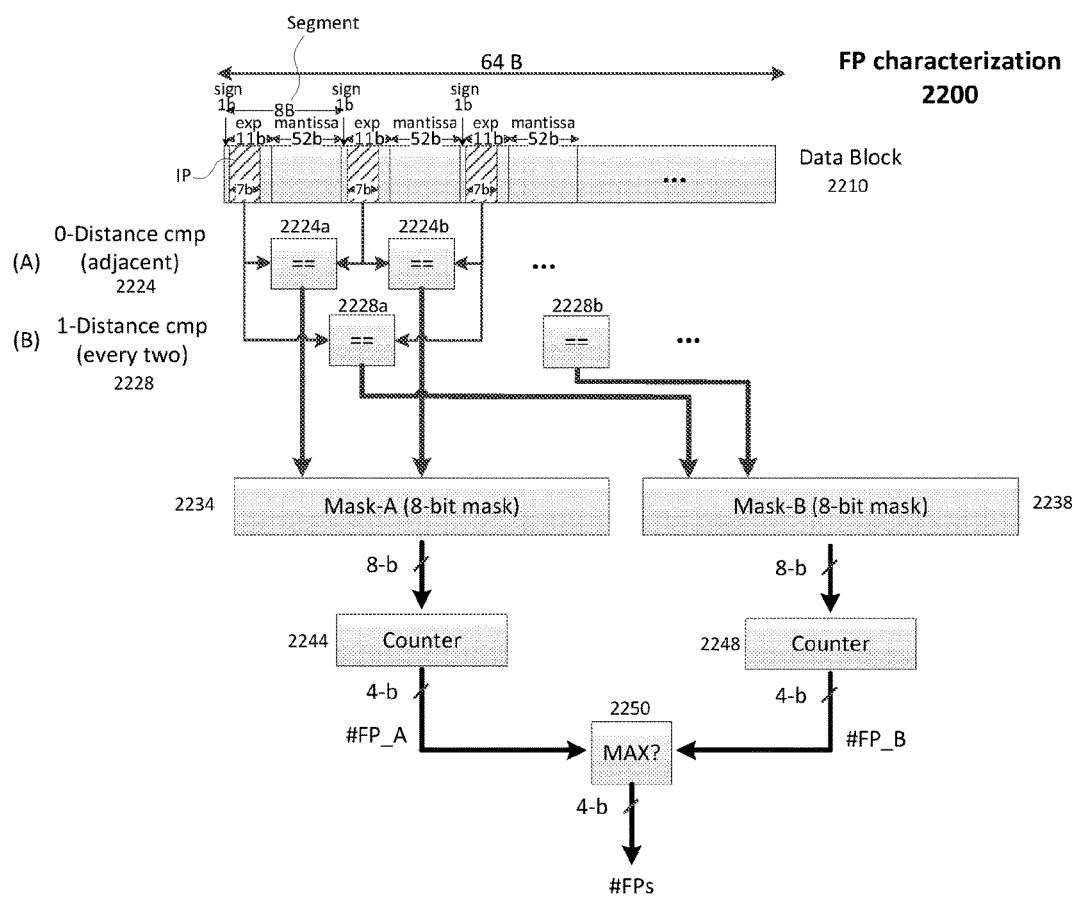
FIG. 22 illustrates an example embodiment of the inspection phase of the prediction method of FIG. 19 targeting to characterize floating-point data types within a data block.

Floating-point numbers: The IP is the 7 bits next to the most significant bit of a segment. The rationale is that floating-point data values contained in a block often have the same exponents or their exponents are clustered; thus comparing the 7-bit IPs to each other (the IP is part of the exponent, according to IEEE-754 standard, if the segment is of floating-point data type) can reveal whether they or a subset of them form a cluster of exponents. The block diagram of FIG. 22 illustrates an example embodiment of the inspection process targeting to characterize floating-point data types within a data block 2210. In said embodiment, the IPs of the block segments are compared in pairs in two ways: A) pairwise comparison of the IPs of segments that have 0-distance from each other (i.e., adjacent segments) 2224; B) pairwise comparison of IPs of segments that are in 1-distance (i.e., the comparing segments have a third segment in-between) 2228. The comparison outcomes (e.g., '1' for a match) are marked in the masks 2234 and 2238. Then, for each of those comparison ways, a respective count is incremented by the counters 2244 and 2248; in the end, the largest count value among the two (i.e., #FP_A and #FP_B) is selected. Since the segment size is 8 bytes, the target floating-point data type is of double precision. Alternative embodiments of said prediction method can be realized by someone skilled in the art to be able to detect single (or other) precision floating-point numbers or according to other floating-point standards.

Figure 23A:
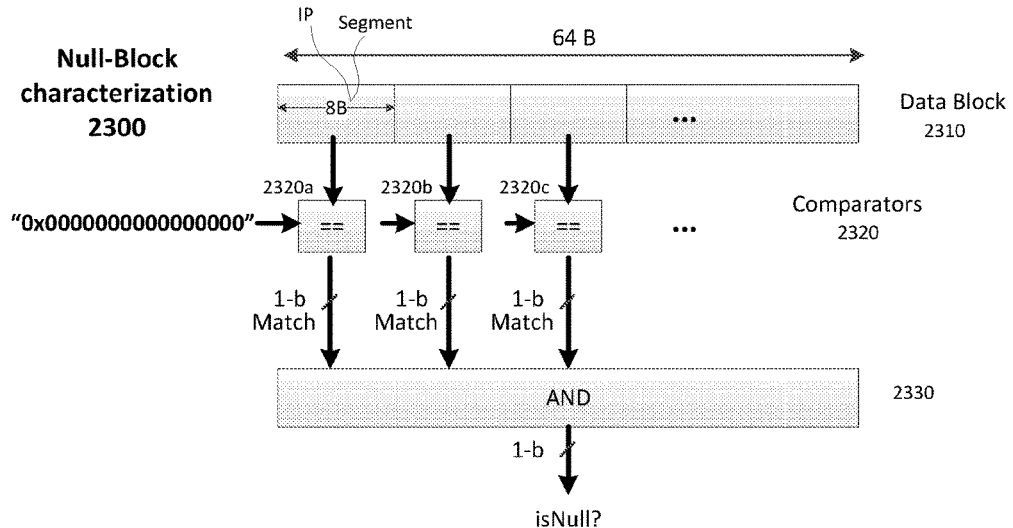
FIG. 23a illustrates an example embodiment of the inspection phase of the prediction method of FIG. 19 targeting to characterize a data block as Null block, meaning a block that comprises zero values.
Figure 23B:
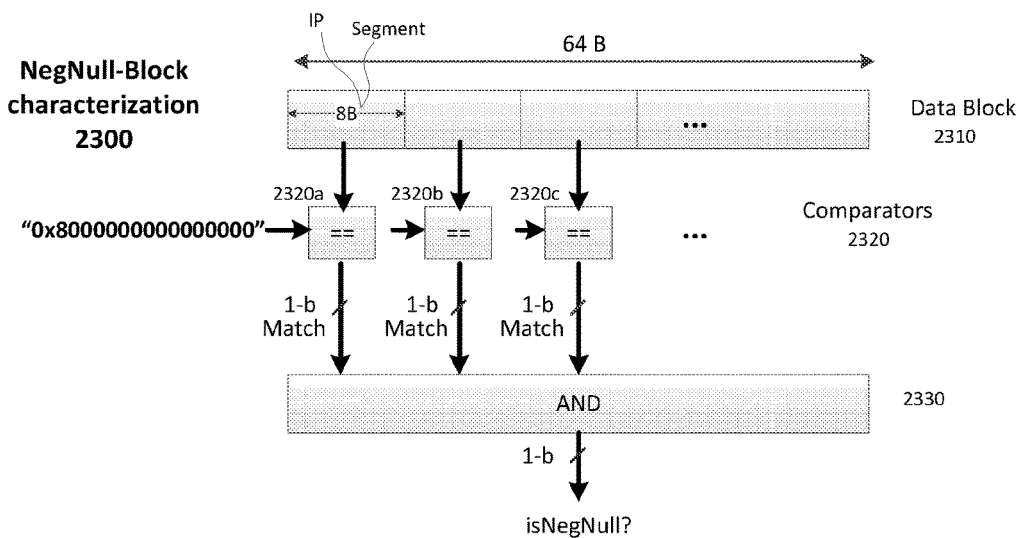
FIG. 23b illustrates an example embodiment of the inspection phase of the prediction method of FIG. 19 targeting to characterize a data block as Negative Null block, meaning a block that comprises negative signed zero values.

(Negative) Null blocks: The IP is the whole segment. If each segment is equal to the zero value (0x00 . . . 0) then the block is characterized as a null block; If each segment is equal to a negative zero value (0x80 . . . 0) then the block is characterized as a negative null block. FIG. 23a illustrates an example embodiment of the inspection process targeting to characterize a data block 2310 as null block, while FIG. 23b illustrates an alternative example embodiment of the inspection process targeting to characterize a data block 2310 as negative null block.

Said data type characterization actions can be executed either sequentially or in parallel depending on the performance criticality of said method. In addition, each characterization step can be implemented by someone skilled in the art so that characterization is executed in a single cycle or pipelined in many cycles as there are distinct operations: comparisons, counting, union/intersection. The comparators and counters can be also implemented in different ways by someone skilled in the art. In alternative embodiments, the block can be divided in segments of various sizes (i.e., a plurality of segment sizes) at the same time in order to uncover data types that appear in various granularities.

Figure 19:
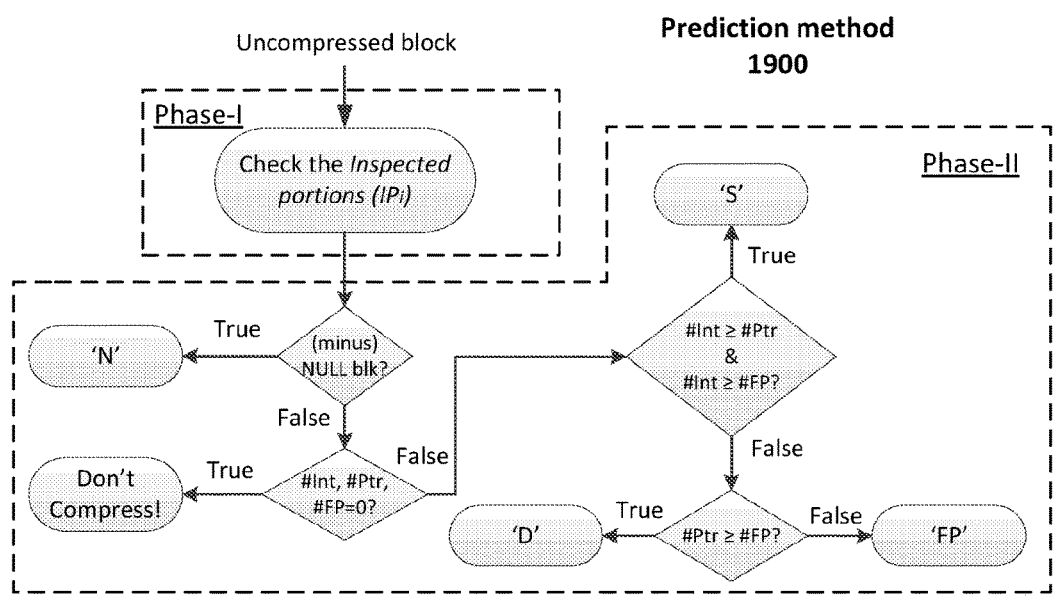
FIG. 19 illustrates an exemplary flow chart of a prediction method, which can be used by an example hybrid data compression method, device and system, comprising two phases: I) inspection of one or a plurality of specific parts of a input data block and II) decision of the best suited compression method among a plurality of them.

The exemplary flow chart of FIG. 19 illustrates an embodiment of said prediction method that is implemented as a heuristic method. In Phase-I, the inspection portions are first checked as previously described; then, in Phase-II the best suited compression scheme (among the aforementioned 'S', 'D', 'N' and 'FP') for compressing the block is selected by evaluating in certain order (in other words, in certain priority) the outcome of Phase-I. First, if a block is characterized as a (negative) null block, the Null-block compression ('N') is selected. If not, it is then checked whether the counts #Int, #FPs and #Ptr are all equal to zero; if it holds, the prediction method speculates that block data will not compress efficiently because of randomness, being encrypted or belonging to a data type not considered. Otherwise, the compression scheme is selected based on the counts of #Int, #Ptr and #FPs: 'S' if the maximum of those counts is #Int; 'D' if the maximum is #Ptr; and 'FP' if the maximum is #FPs. If some or all counts are instead equal to each other, then the compression scheme are selected in the order: 'S', 'D', 'FP'.

Figure 24:
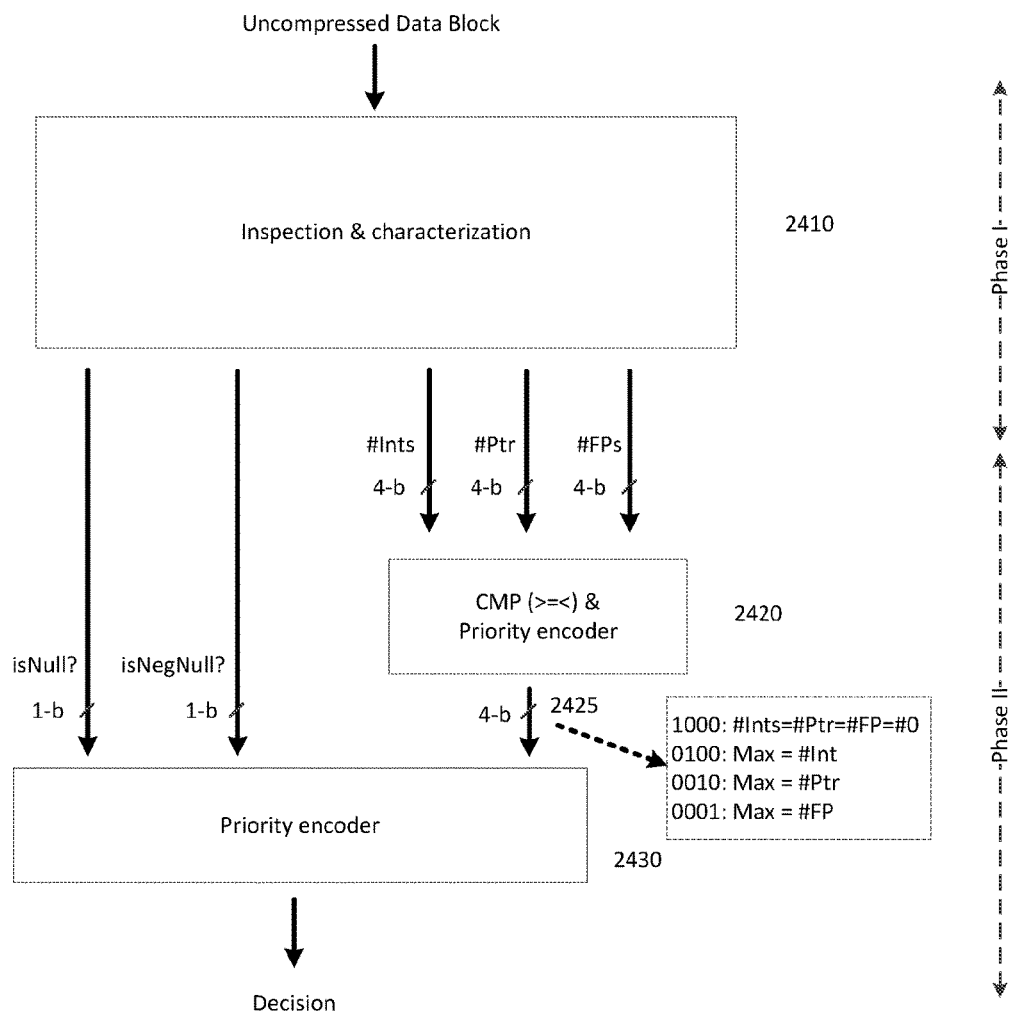
FIG. 24 illustrates an example embodiment of the implementation of the prediction method of FIG. 19 comprising a block inspection device which implements the Phase-I of the prediction method of FIG. 19 and a decision device which implements the Phase-II of the prediction method of FIG. 19; wherein decision device comprises comparators and priority encoders to derive decision of the best suited compression device.

The block diagram of FIG. 24 shows an example block diagram of a hardware implementation of the prediction method of FIG. 19. Said block diagram comprises an Inspection & Characterization unit 2410 which implements the Phase-I of the prediction method of FIG. 19 and comparators and priority encoders 2420 and 2430 which together implement Phase-II of the prediction method of FIG. 19. The Inspection and Characterization unit 2410 comprises further the INT-type characterization unit 2000, the PTR-type characterization unit 2100, the FP-type characterization unit 2200 and the NullBlock- and NegNullBlock-type characterization units 2300. The outcomes of the INT, FP and PTR characterization units (outputs from the unit 2410) are compared first by the unit 2420 to create a 4-bit encoding signal 2425:1000 (#Ints=0 & #FPs=0 & #Ptr=0), 0100 (MAX=#Int); 0010 (MAX=#Ptr); and 0001 (MAX=#FP). Said encoding signal 2425 is input to a priority encoder 2430 with the isNull and isNegNull signals. The priority encoder 2430 implements the selection of the best suited compression scheme in the order (priority) as shows in phase-II of the prediction method of FIG. 19. Said hardware implementation can be pipelined in two or more stages by someone skilled in the art.

Alternative embodiments of said prediction method as well as other prediction methods can be realized by those skilled in the art. Importantly, other compression schemes and/or other data types should be considered when those skilled in the art realize alternative embodiments of the hybrid data compression methods, devices and systems depending on the target system, context and application domain.

Figure 25:
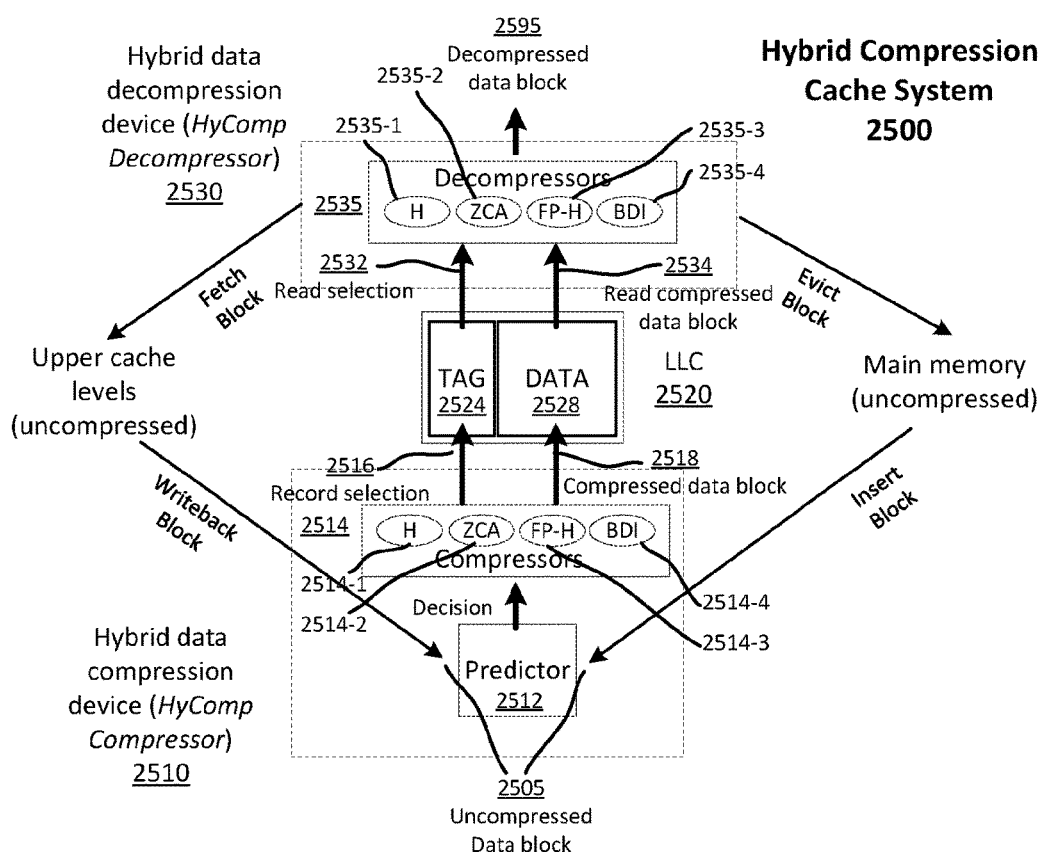
FIG. 25 illustrates an example embodiment of a hybrid data compression system similar to the one of FIG. 18 which is integrated into the last-level cache subsystem of a computer system.

FIG. 25 shows yet another embodiment 2500 of the HyComp hybrid data compression system of FIG. 18, but when applied to the cache subsystem of a computer system and in particular in the last-level cache (LLC). Assuming that the main memory and the other upper-level caches of the cache hierarchy save data in uncompressed form, data are compressed before inserted into the LLC from the memory or when they are written back to LLC from an upper-level cache. On the other hand, when a block is evicted from the LLC or when it is fetched by an upper-level cache it needs to be decompressed. The HyComp system compresses uncompressed data blocks 2505 inserted from memory or written back from the upper-level cache by selecting for each uncompressed data block the best suited compression scheme based on data-type prediction 2512 similarly to the aforementioned embodiments. The compressed data block 2518 is then inserted in the data array 2528 of the LLC, while the scheme used is recorded 2516 as metadata in the tag store 2524, which typically saves metadata of the cache lines (e.g., tag, valid and dirty bits, replacement status). When a compressed data block 2534 is requested by the upper level caches or evicted to main memory, the compressed data block 2534 is simply decompressed by the appropriate decompressor 2535 based on the metadata that was recorded in the tag store during compression.

The hybrid compression cache system 2500 of FIG. 25 uses specific compression schemes 2514-1, 2514-2, 2514-3, 2514-4, i.e., a Huffman-based statistical compression scheme (for instance the one disclosed in US patent application publication No U.S. 2013/0311722), BDI (disclosed in Gennady Pekhimenko, Vivek Seshadri, Onur Mutlu, Phillip B. Gibbons, Michael A. Kozuch, and Todd C. Mowry, 2012, "Base-delta-immediate compression: practical data compression for on-chip caches", in *Proceedings of the 21st international conference on Parallel architectures and compilation techniques* (*PACT '12*)), FP-H (disclosed in the aforementioned patent application METHODS, DEVICES AND SYSTEMS FOR SEMANTIC-VALUE DATA COMPRESSION AND DECOMPRESSION by the present applicant and inventors) and ZCA (disclosed in Julien Dusser, Thomas Piquet, and André Seznec. 2009, "Zero-content augmented caches", in *Proceedings of the 23rd international conference on Supercomputing* (*ICS '09*)) associated to integer, pointers, floating-point and null block data types, respectively. Those schemes are selected because they can be implemented in hardware, thus can be applied to cache compression. They yield efficient compressibility for the respective data types while their compression and decompression latencies are relatively low for the example compressed cache subsystem.

Figure 26:
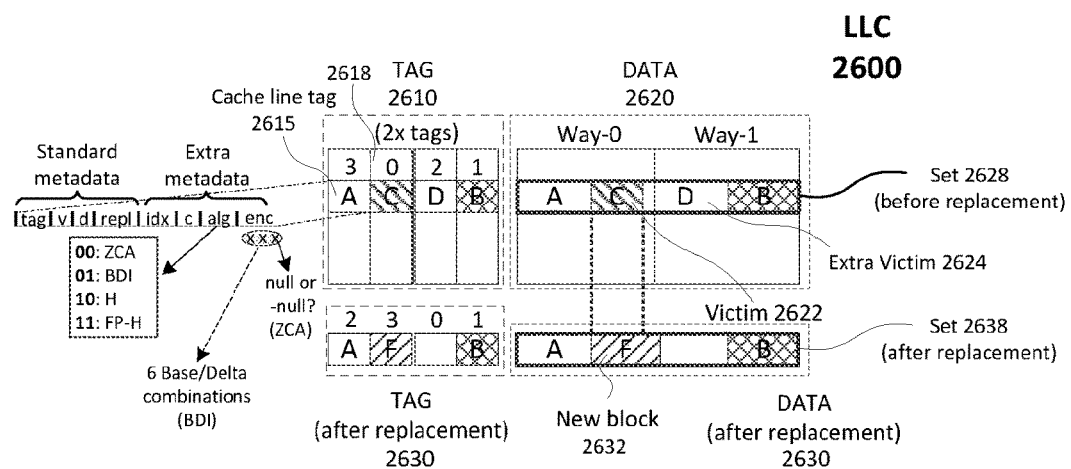
FIG. 26 illustrates an example embodiment of the cache organization, comprising a tag store and a data store, when a hybrid data compression system is integrated into the last-level cache.

An embodiment of the cache organization when hybrid data compression is applied to is depicted in FIG. 26 and comprises the TAG store 2610 and the DATA store 2620. This cache embodiment is 2-way set associative. In a conventional cache when no compression is applied, each way stores an uncompressed cache block (or cache line) and is associated with a particular tag (e.g., the cache line tag 2615). Each tag comprises a plurality of metadata (i.e., standard metadata), as shown on the left of FIG. 26: "tag" is related to the block address; 'v' is the valid bit and is set if the block is valid; 'd' is the dirty bit and is set if the block was modified; and "repl" is the replacement status, i.e., if the replacement policy is the least-recently-used (LRU), then the block with the smallest counter (the counter is decremented based on the block use) is replaced when the cache set is full.

On the other hand, when compression is applied to said cache subsystem of FIG. 26, the cache organization needs to be modified. As in prior art cache compression designs, the tag store is decoupled from the data store and more tags are associated with each set in order to be able to store more cache blocks and take advantage of the released space due to compression. A compressed cache block is therefore placed at an arbitrary byte position inside the set and is located using a pointer, which is stored in the metadata in the tag store; this pointer is denoted as "idx" in the extra metadata in FIG. 26. For example, in the cache embodiment of FIG. 26, two times more tags (i.e., 4 tags per cache set) are associated with each cache set. The association between tags and cache blocks is denoted with letters (A, B, C, and D). Furthermore, the data store 2620 comprises a plurality of cache sets. Each set is similar to the set 2628, which comprises up to 2 uncompressed cache blocks and up to 4 compressed ones. The compressed block A is stored in the beginning of the cache set 2628 (0 byte position); the compressed block C is saved in the next byte position after the end of the compressed block A, while the compressed block D spans in two ways. An alternative placement policy of compressed blocks is referred to as segmentation, which divides a cache set into fixed-size segments and then each compressed block is assigned a variable number of segments based on the size of the compressed block. Alternative placement policies of compressed blocks can be implemented by those skilled in the art.

If a new block is inserted into the cache and is to be saved in the example cache set 2628, where all the tags are used by compressed blocks, one of those blocks need to be evicted (also known as victim block). In the cache embodiment of FIG. 26, the replacement policy is least-recently-used (LRU); thus the block C which has the smallest LRU count 2618 is the victim block 2622. One victim block is sufficient in conventional cache designs where data are saved uncompressed; however, in the hybrid data compression cache embodiment and in most compressed cache designs, if the new block has larger size than the victim one, more blocks in the cache set need to be evicted. Evicting the next LRU blocks may take time, as compaction is also required; compaction is the process of moving compressed blocks to release contiguous free space. In this example embodiment, the adjacent blocks (the block D 2624 in FIG. 26) are selected to be evicted. The cache set 2638, which is shown at the bottom of FIG. 26, is similar to the cache set 2628 after replacing the blocks 2622 and 2624 with the new block F 2632. Conversely, if the new block is smaller than the victim one, compaction is done in order to release more contiguous space to the next LRU block.

Other extra metadata that need to be added in the tag when compression is applied in the cache subsystem is the Compression status bit (denoted as 'c' in FIG. 26), which Indicates whether a block is compressed. When hybrid data compression is applied in the cache, the selected compression scheme that is predicted to be used in an example block is recorded in the "alg" metadata. In this embodiment, "alg" defines 4 schemes: ZCA, BDI, H and FP-H. The special encoding metadata (denoted as "enc" in FIG. 26) is compression scheme dependent. For example, if the selected scheme is BDI, it requires 3 bits to record the base/delta combination used to encode an example block among 6 cases: 1) Base=8 bytes and Delta=1, 2 or 4 bytes (3 cases); 2) Base=4 bytes and Delta is 1 or 2 bytes (2 cases); and 3) Base=2 bytes and Delta is 1 byte. If the selected scheme is ZCA, the rightmost bit of the special encoding determines whether it is a null block or a negative null block. The rest of the bits are not used. The other compression schemes do not need to use the "enc" bits.

Figure 2:
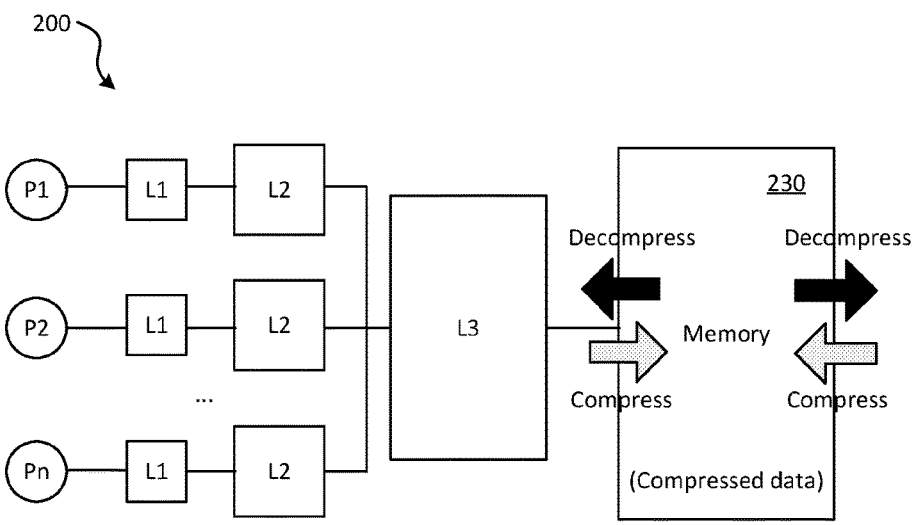
FIG. 2 illustrates the block diagram of FIG. 1, where the main memory saves data in compressed form.
Figure 3:
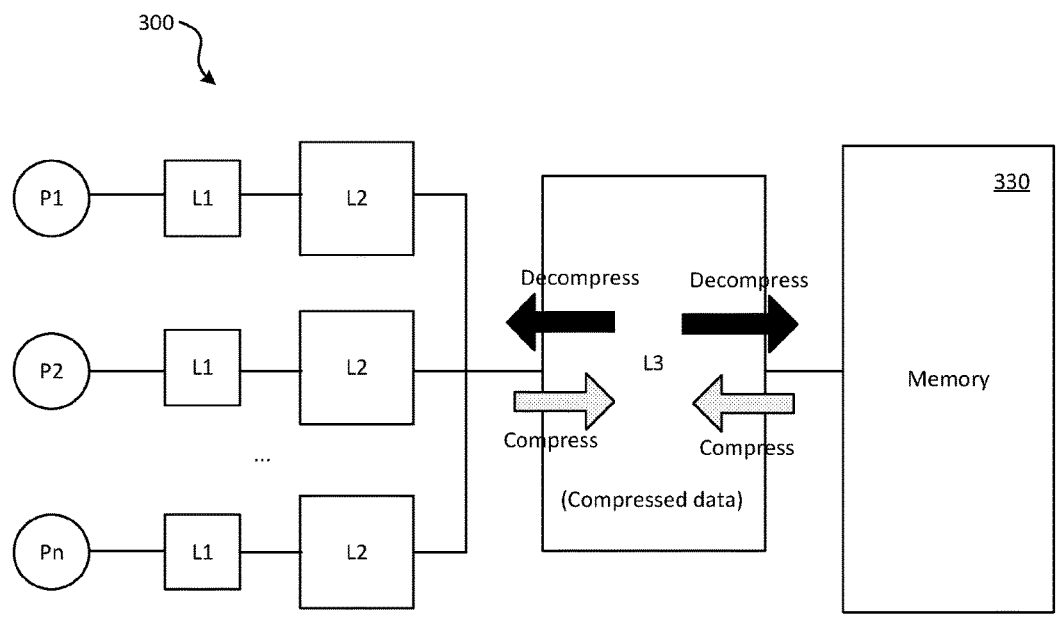
FIG. 3 illustrates the block diagram of FIG. 1, where the L3 cache saves data in compressed form. Other cache levels can also store data in compressed form.

If the disclosed hybrid data compression methods, devices and systems are applied to the memory subsystem of a computer system (like the one of FIG. 2), said metadata which track the selected compression scheme of the prediction method of said methods, devices and systems, previously denoted as "alg", and the respective "enc" metadata related to the selected compression scheme can be saved in the page table structure. The page table comprises the virtual to physical address translations as well as other information such as the present bit, dirty bit, etc for each page. For example, if the block of data values, which hybrid compression is applied to, corresponds to, e.g., a page then said "alg"/"enc" metadata can be saved along with said information bits per page in the page table. When a page is accessed, its virtual-to-physical translation is maintained in a hardware cache structure, the Translation Lookaside Buffer (TLB), therefore said "alg"/"enc" metadata can be also stored in the TLB.

Figure 4:
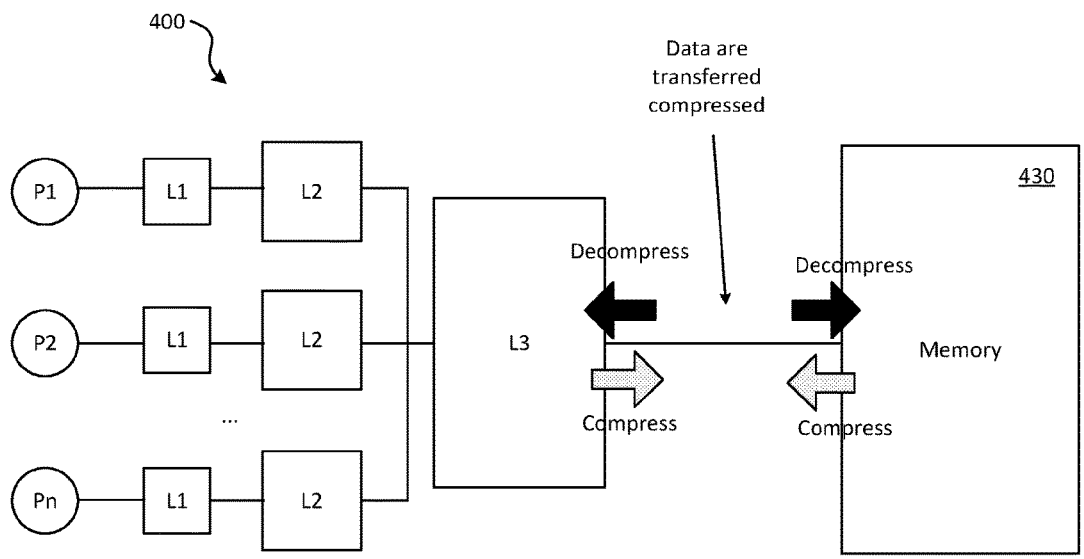
FIG. 4 illustrates the block diagram of FIG. 1 where data are compressed in a communication means, for example when transferred between the memory and the cache hierarchy.
Figure 5:
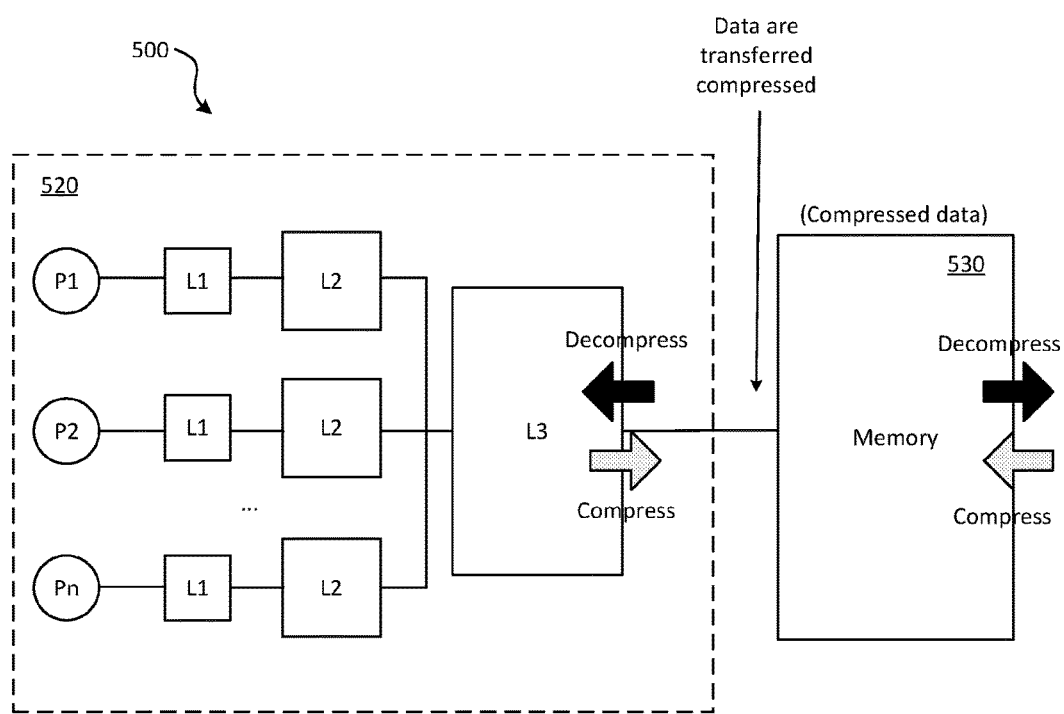
FIG. 5 illustrates the block diagram of FIG. 1 where compression can be applied to the main memory and the link that connects the memory to the cache hierarchy. In general compression can be applied to any combination of the parts like the cache hierarchy, the transferring means (e.g., link that connects the memory to the cache subsystem) and main memory.
Figure 7:
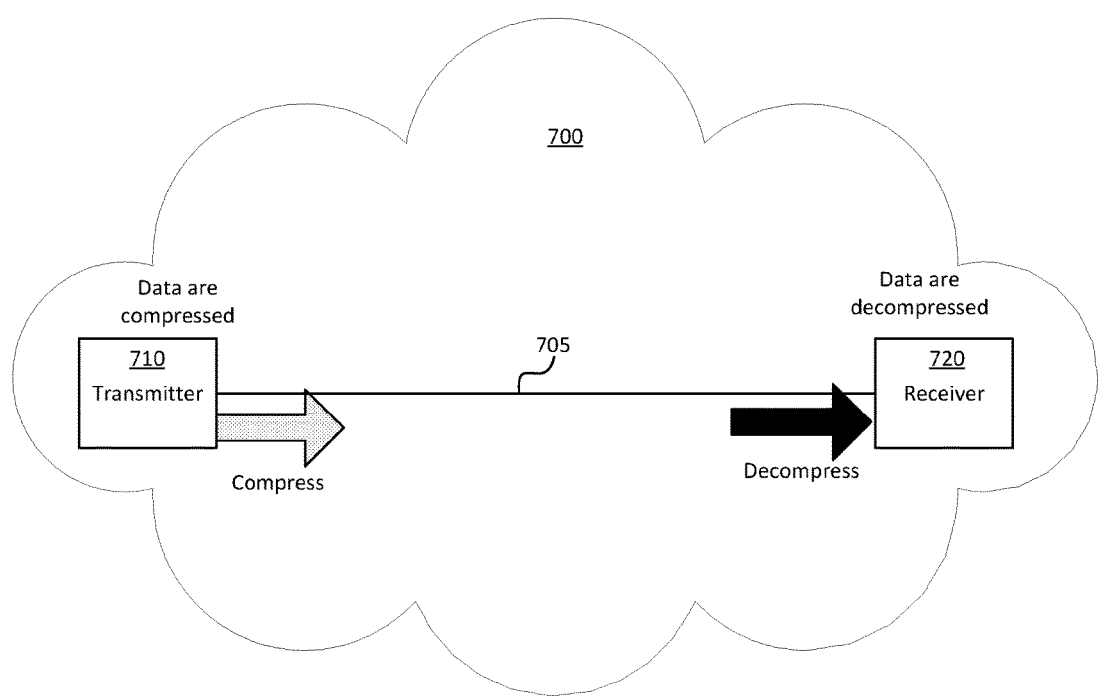
FIG. 7 illustrates a block diagram of the data transmission link of FIG. 6 where the data transferred are in compressed form so they may need to be compressed in the transmitter and decompressed in the receiver.

In an alternative embodiment, where the disclosed hybrid data compression methods, devices and systems are applied to the link subsystem of a computer system (like the one of FIG. 4) or in a communication network (like the one of FIG. 7), all or a subset of "alg"/"enc" metadata combinations can be maintained in a metadata cache. Depending on the link/network configuration, a link end can be a source: block is compressed and transmitted; and/or a destination: block is received and decompressed. If a link end is a source, then it comprises a compressor and a metadata cache; if it is a destination, it comprises a decompressor and a metadata cache; if it is both source and destination, it comprises a compressor, a decompressor and one metadata cache used by both compressor and decompressor or, in alternative, one metadata cache is used by the compressor and another metadata cache is used by the decompressor. FIG. 30 illustrates an example embodiment of a link subsystem, wherein the hybrid data compression methods, devices and systems are applied to and wherein one end of the link (node i) acts as a source (transmitter) and the other end of the link (node j) acts as a destination (receiver).

An instance of said metadata cache comprises one or a plurality of entries, wherein each entry contains the ID of one specific combination of said "alg"/"enc" metadata, e.g., "ZCA,negNull", "BDI,B=4/D=2". When a data block is compressed using a predicted compression device/scheme, the ID of said predicted device/scheme is looked up in the metadata cache of the source to obtain the index of the respective metadata cache entry which keeps said ID. Said index is transmitted prior to, after or along with the compressed block. The index is used to access the metadata cache of the destination to retrieve the ID of the suitable decompression device/scheme. The source and destination metadata caches must be synchronized to keep their contents coherent. The size of the metadata cache determines its access time (hence compression and decompression latency) and the index width: as a plurality of compression schemes/devices is used, the metadata cache and therefore index and access time can grow large. In an alternative embodiment, the metadata cache can keep only a subset (e.g., 4 entries) of the IDs of the compression schemes/devices, e.g., if a set of example schemes/devices is continuously used for a plurality of data blocks. If the ID of a predicted scheme/device is not found in the source metadata cache, one of its entries is replaced using an example cache replacement policy (e.g., LRU) and the destination metadata cache is updated accordingly. Those skilled in the art can implement alternative ways to record and retrieve the predicted compression scheme/device of the hybrid data compression methods, devices and systems when applied to a computer system or a communication network."

The Huffman-based statistical compression scheme assigns variable-length codewords to the data values based on their statistical properties, e.g., frequency of occurrence: short codewords to more frequent values and longer codewords to less frequent ones. If the encoding is not predefined, said Huffman-based statistical compression scheme comprises two phases: the training phase and the compression phase. During the training phase, the value-frequency statistics of the occurring values (i.e., values stored in the LLC in the aforementioned embodiment of the Hybrid compression cache system) are monitored and collected in a table-like structure that comprises <value, counter> tuples. Example embodiments of said table are described in prior art. When said value-frequency statistics are sufficiently collected, an example encoding is generated using the Huffman coding algorithm; said encoding is then used to compress data values during the compression phase. The quality of the generated encoding depends significantly on the accuracy of the statistics collection process. Hence, embodiments of hybrid data compression methods, devices and systems can apply prediction not only during compression but also during the training phase of such compression schemes. This way, the data blocks that are characterized of a data type that is irrelevant to the type which is selected to be compressed by said statistical compression schemes can be disregarded from the value-frequency statistics collection yielding potentially a more representative set of statistics, thus a better encoding. In an alternative embodiment, as the statistics collection process does not require any metadata, the finer-grain per-segment type information can be used to decide whether said segment should be used or disregarded from the collection of statistics during the training phase of said statistical compression schemes instead; said per-segment type information can be retrieved, for example, by the masks 2034/2038 (FIG. 20), 2134/2138 (FIG. 21), 2234/2238 (FIG. 22) depending on the association between certain data types and statistical compression schemes.

BDI compresses a cache block using delta compression by encoding the block values with deltas to two base values. In its main configuration, one of said base values is zero and the other is the first non-zero value of the block. BDI attempts a plurality of base/delta granularities but the block is compressed only if all the values are encoded using the same base/delta granularity (one of the 6 cases described previously). However, BDI suffers from the limitation that a block is compressed only if all the values in the block fall in two value ranges, otherwise it is left uncompressed. If a block comprises data values that fall in three or more value ranges, it will not be compressed even if the dominating data type is pointer. In such cases, such this example embodiment where there is a known compression algorithm limitation (or weakness), extra selection criteria beyond the dominating data type can be introduced in the decision process when one skilled in the art builds the prediction method. One such criterion in this embodiment is to check whether the block values fall in 3 or more ranges and then even if the dominating data type is pointer, another compression scheme can be selected instead.

In an alternative embodiment of a hybrid data compression system, incorrect predictions of the best suited compression algorithm for a characterized block type that occur frequently can be detected and possibly corrected by comparing the decisions of the predictor to an oracle selector; said oracle selector is an ideal selector that always selects the best compression scheme. The method of FIG. 27 illustrates an exemplary flow chart, which for a monitoring window (measured in repetitions in FIG. 27, which is a defined number of predictions that are compared towards the oracle selection) the predicted compression scheme is compared to the selected compression scheme of the oracle; the oracle can be implemented by trying to compress the input uncompressed block using all the schemes in brute-force mode and select the one that yields the best compressibility. The outcome of the comparison is tracked in a counter; there is a plurality of counters, one for each dominating data type. At the end of the monitoring window, if the measured misprediction for each dominating data type tracked (during the monitoring window) surpasses a certain threshold (TH), the selected compression scheme of the predictor can be adjusted to the one determined by the oracle selector for said dominating data type occurrence from that point and onwards, potentially improving the accuracy of the prediction method at runtime. Said monitoring can be repeated periodically or on demand. The dominating data type is used as an example criterion to mark the conditions under which a discrepancy between the predicted compression scheme and the oracle compression scheme occurs. Alternative embodiments can use other example ways to describe said conditions, e.g., using the dominating data type and the second dominating data type or predicted data types within a block. Those skilled in the art can realize alternative methods to correct inaccurate predictions of prediction methods and devices used in hybrid data compression methods, devices and systems.

Alternative embodiments can use other goals when selecting the best suited compression scheme beyond the best achieved compression. For example, when hybrid data compression is applied in the cache subsystem of a computer system, such as the embodiment of FIG. 25, the compression schemes can be selected not only based on their compression efficiency but also on their impact on compression and decompression latency. For example, if the best compression scheme A for a characterized block type yields 10% better compressibility than the second best compression scheme B but increases the cache access time by 30% due to decompression latency, then the scheme B can be selected over A.

The prediction method can preferably be executed at run-time by any logic circuitry included in or associated with a processor device/processor chip or memory device/memory chip. Further inventive aspects of the disclosed invention therefore include logic circuitry, a processor device/processor chip and a memory device/memory chip configured to execute the aforesaid method.

It shall be noticed that other embodiments than the ones explicitly disclosed are equally possible within the scope of the respective invention. For instance, each of the disclosed inventions may be implemented for other types of memory than cache memories, including but not limited to main memories (e.g. random access memories) for computers. Alternatively or additionally, each of the disclosed inventions may be implemented for link compression of data being communicated between for instance a processor and a memory.

There are generally no particular limitations in data sizes for any of the entities (e.g. data set, data type, data value, data field, data block, cache block, cache line, data segments, etc) referred to in this patent application.

With some reference to FIG. 28, FIG. 29 and FIG. 31, general inventive aspects, generalized over the specific embodiments shown in FIG. 13-FIG. 27 and FIG. 30, will now be described. Like reference numerals will be used; a reference numeral having the format XXnn in one of the drawings generally represents a same or at least corresponding element YYnn in any of the other drawings.

One general inventive aspect is a hybrid data compression device (e.g. 1810; 2510) for compressing an uncompressed data block (e.g. 1805; 2505) into a compressed data block (1818; 2518), the uncompressed data block comprising one or a plurality of data values of one or a plurality of data types. The hybrid data compression device comprises a plurality of data compressors (e.g. 1814; 2514), each compressor being configured for a respective data compression scheme (e.g. 1814-1 . . . 1814-*n*; 2514-1 . . . 2514-*n*). The hybrid data compression device also comprises a predictor mechanism (e.g. 1812; 2512) configured for predicting data types of data values of the uncompressed data block (e.g. 1805; 2505) and for selecting an estimated best suited data compressor among said plurality of data compressors using as main criterion a dominating data type among the predicted data types. The hybrid data compression device is configured to generate the compressed data block (e.g. 1818; 2518) by causing the selected estimated best suited data compressor to compress the whole of the uncompressed data block.

The hybrid data compression device may be configured to generate (e.g. 1816; 2516; 3016) metadata (e.g. 1824; 2524; 3024) associated with the compressed data block (e.g. 1818; 2518) and serving to identify the data compression scheme of the selected estimated best suited data compressor. The hybrid data compression device may moreover be configured to store the generated metadata in a data storage (e.g. 1820; 2520) together with the compressed data block (e.g. 1818; 2518), the data storage being accessible to a data decompression device (e.g. 1830; 2530). Alternatively, the hybrid data compression device may be configured to transmit the generated metadata (e.g. 3024) over a link (e.g. 3020) together with the compressed data block (e.g. 3018) to a data decompression device (e.g. 3030).

The plurality of data compressors (e.g. 1814; 2514) may include a first data compressor configured for a first data compression scheme, and a second data compressor configured for a second data compression scheme, different from the first data compression scheme. Each of the first and second data compression schemes may be a lossless compression scheme or a lossy compression scheme.

Advantageously, the first and second data compression schemes are lossless compression schemes selected as two of the following:
  statistical (variable-length) encoding (such as, for instance, Huffman compression, canonical Huffman compression, arithmetic coding),
  dictionary-based compression,
  delta encoding,
  pattern-based compression,
  significance-based compression, or
  common-block-value compression (such as, for instance, null block compression).

Typically, the first data compression scheme is designed to exploit data locality between data values of a first data type, the data locality being temporal, spatial or a combination thereof, whereas the second data compression scheme is designed to exploit data locality between data values of a second data type, the data locality being temporal, spatial or a combination thereof.

The data block may typically be one of the following:
a cache line, cache set, cache block or cache sector for storage in a cache in a computer system,
a memory row, a memory page or memory sector for storage in a memory or transfer within a computer system, and
a packet, flit, payload or header for transfer over a transmission link in a data communication system.

The data types of the data values may, typically but non-limiting, be any of the following: integers, pointers, floating-point numbers, characters, strings, boolean values, code instructions, or data types defined by a specific format or standard (such as, for instance, a video or audio format or standard).

Advantageously, the predictor mechanism (e.g. 1812; 2512) of the hybrid data compression device (e.g. 1810; 2510) is configured to divide the uncompressed data block (e.g. 1805; 2505) into segments; for all segments, inspect an inspection bit portion of each segment to classify the segment as a predicted data type among a plurality of candidate data types; and compare occurrences of the predicted data types of all segments to determine the dominating data type of the uncompressed data block. Advantageously, the inspection bit portions are different for different candidate data types.

The candidate data types may typically be two or more of: integers, pointers, floating-point numbers, characters, strings, boolean values, common data value block, data code instructions, or data types defined by a specific format or standard.

In an advantageous embodiment (e.g. FIG. 20), one of the candidate data types is integer, the size of the data block is m bytes, the size of the segment is n bytes, m/n is a multiple of 2, the inspection bit portion is the p most significant bytes of the segment, and n/p is 2. The following values may, for instance, apply: m=64, n=8, p=4. The predictor mechanism (e.g. 1812; 2512) is configured to classify the segment as integer if the inspection bit portion is equal to any of a number of predefined p-byte values which, for instance, may be 0x00000000 and 0xFFFFFFFF.

In this or another an advantageous embodiment (e.g. FIG. 21), one of the candidate data types is pointer, the size of the data block is m bytes, the size of the segment is n bytes, m/n is a multiple of 2, the inspection bit portion is the p most significant bytes of the segment, and n/p is 2. The following values may, for instance, apply: m=64, n=8, p=4. The predictor mechanism (e.g. 1812; 2512) is configured to classify the segment as pointer if the two most significant bytes but not the two least significant bytes of the inspection bit portion are equal to a predefined p/2-byte value which, for instance, may be 0x0000.

In this or another an advantageous embodiment (e.g. FIG. 22), one of the candidate data types is floating-point numbers, the size of the data block is m bytes, the size of the segment is n bytes, m/n is a multiple of 2, and the inspection bit portion is the q most significant bits next to the most significant bit of the segment. The following values may, for instance, apply: m=64, n=8, q=7. The predictor mechanism (e.g. 1812; 2512) is configured to classify the segment as floating-point number by matching the inspection bit portion of the segment with inspection bit portions of neighboring segments in the data block, indicative of same or clustered floating-point exponents.

In this or another an advantageous embodiment (e.g. FIG. 23a and FIG. 23b), one of the candidate data types is common data value, the size of the data block is m bytes, the size of the segment is n bytes, m/n is a multiple of 2, and the inspection bit portion is the whole segment. The following values may, for instance, apply: m=64, n=8. The predictor mechanism (e.g. 1812; 2512) is configured to classify the segment as common data value when all its data values have a same common data value. Advantageously, the common data value is a null value.

Advantageously, the hybrid data compression device is configured to select, as the estimated best suited data compressor, a data compressor (e.g. 1814; 2514) having common-block-value compression as its data compression scheme when all segments of the uncompressed data block (e.g. 1805; 2505) have been classified as common data value.

Moreover, the predictor mechanism (e.g. 1812; 2512) may be configured, when two different predicted data types of the segments have the same occurrence, to prioritize one over the other when determining the dominating data type of the uncompressed data block. For instance, the predictor mechanism (e.g. 1812; 2512) may be configured to prioritize integer over pointer and floating-point number, and pointer over floating-point number when determining the dominating data type of the uncompressed data block.

Also, the predictor mechanism (e.g. 1812; 2512) may be configured, when there are no occurrences of predicted data types of the segments, to select a default data compressor as the estimated best suited data compressor. Alternatively, the predictor mechanism (e.g. 1812; 2512) may be configured, when there are no occurrences of predicted data types of the segments, to select no compression instead of an estimated best suited data compressor, hence refraining from compressing the uncompressed data block.

In one embodiment, the hybrid data compression device (e.g. 1810; 2510) is further configured to:
during a plurality of compression cycles, monitor the respective selected estimated best suited data compressors with respect to ideal selections of data compressors for the respective dominating data types;
detect that another data compressor would have been more efficient in terms of compressibility of a particular dominating data type; and
for future compression cycles, change the best suited data compressor to said another data compressor for the particular dominating data type.

The ideal selections of data compressors for the respective dominating data types may be provided by an oracle selector which compresses the uncompressed data blocks using the data compression schemes of all of the plurality of data compressors (e.g. 1814; 2514) and chooses, as the respective ideal selection, the compressor having the data compression scheme which yields best compressibility of the respective uncompressed data block.

In one embodiment of the hybrid data compression device the plurality of data compressors includes a first data compressor (e.g. 1630) configured for a first data compression scheme being a common-block-value compression scheme, and a second data compressor (e.g. 1620) configured for a second data compression scheme, which is different from the first data compression scheme and is one of statistical (variable-length) encoding, dictionary-based compression, delta encoding, pattern-based compression, and significance-based compression. The hybrid data compression device of this embodiment is configured to generate the compressed data block (e.g. 1618) by causing the first data compressor (e.g. 1630) to compress the whole of the uncompressed data block (e.g. 1605) into a compressed common-value data block if a common data value is found by the predictor mechanism (e.g. 1630) to dominate the uncompressed data block (e.g. 1605), and otherwise generate the compressed data block (e.g. 1618) by causing the second data compressor (e.g. 1630) to compress the whole of the uncompressed data block (e.g. 1605) according to the second data compression scheme. The compressed common-value data block may advantageously contain a single bit only. Beneficially, the predictor mechanism (e.g. 1630) is integrated with the first data compressor (e.g. 1630) in this embodiment. Moreover, the predictor mechanism (e.g. 1630) is beneficially configured to find that the common data value dominates the uncompressed data block (e.g. 1605) when all its data values have the common data value. The common data value may typically be a null value or, alternatively, another specific common data value.

Figure 28:
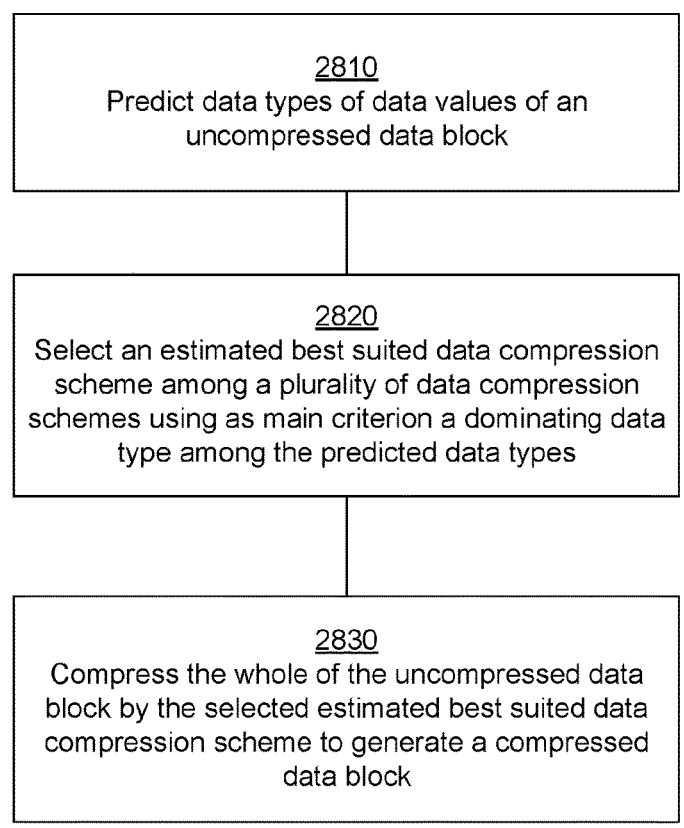
FIG. 28 is a schematic flow chart illustrating a general hybrid data compression method according to the invention.

A general inventive data compression method is shown in FIG. 28. In addition to and/or as refinement of the functionality disclosed at 2810-2830 in FIG. 28, this general inventive data compression method may have any or all of the functional features of the data compression device according to the general inventive aspect and its various embodiments as described above.

Another general inventive aspect is a hybrid data decompression device (e.g. 1830; 2530) for decompressing a compressed data block (e.g. 1834; 2534) into a decompressed data block (e.g. 1895; 2595) comprising one or a plurality of data values of one or a plurality of data types. The compressed data block may have been generated by a hybrid data compression device according to the general inventive aspect or its various embodiments as described above. The hybrid data decompression device comprises a plurality of data decompressors (e.g. 1835; 2535), each decompressor being configured for a respective data decompression scheme (e.g. 1835-1 . . . 1835-n; 2535-1 . . . 2535-n), The hybrid data decompression device is configured to generate the decompressed data block (e.g. 1895; 2595) by causing a selected estimated best suited data decompressor among said plurality of data decompressors (e.g. 1814; 2514) to decompress the whole of the compressed data block.

The hybrid data decompression device may be configured to retrieve (e.g. 1832; 2532; 3032) metadata (e.g. 1824; 2524; 3024) associated with the compressed data block (e.g. 1834; 2534) and select the estimated best suited data decompressor based on the metadata. Moreover, the hybrid data decompression device may be configured to retrieve the metadata from a data storage (e.g. 1820; 2520) together with the compressed data block (e.g. 1834; 2534), the data storage being accessible to a data compression device (e.g. 1810; 2510). Alternatively, the hybrid data decompression device (e.g. 3030) may be configured to receive the metadata (e.g. 3034) over a link (e.g. 3020) together with the compressed data block (e.g. 3038) from a data compression device (e.g. 3010).

The plurality of data decompressors (e.g. 1835; 2535) may include a first data decompressor configured for a first data decompression scheme, and a second data decompressor configured for a second data decompression scheme, different from the first data decompression scheme. Each of the first and second data decompression schemes may be a lossless decompression scheme or a lossy decompression scheme.

Advantageously, the first and second data decompression schemes are lossless decompression schemes selected as two of the following:
- statistical (variable-length) decoding (such as, for instance, Huffman decompression, canonical Huffman decompression, arithmetic decoding);
- dictionary-based decompression;
- delta decoding;
- pattern-based decompression;
- significance-based decompression; or
- common-block-value decompression (such as, for instance, null block decompression).

The data block may typically be one of the following:
- a cache line, cache set, cache block or cache sector for storage in a cache in a computer system,
- a memory row, a memory page or memory sector for storage in a memory or transfer within a computer system, and
- a packet, flit, payload or header for transfer over a transmission link in a data communication system.

The data types of the data values may, typically but non-limiting, be any of the following: integers, pointers, floating-point numbers, characters, strings, boolean values, code instructions, or data types defined by a specific format or standard (such as, for instance, a video or audio format or standard).

In one embodiment of the hybrid data decompression device, the plurality of data decompressors includes a first data decompressor (e.g. 1720) configured for a first data decompression scheme being a common-block-value decompression scheme, and a second data decompressor (e.g. 1710) configured for a second data decompression scheme, which is different from the first data decompression scheme and is one of statistical (variable-length) decoding, dictionary-based decompression, delta decoding, pattern-based decompression, and significance-based decompression. The hybrid data decompression device of this embodiment is configured to check if the compressed data block (e.g. 1705) is a compressed common-value data block and if so generate the decompressed data block (e.g. 1795) by causing the first data decompressor (e.g. 1720) to decompress the whole of the compressed data block (e.g. 1705) into a decompressed common-value data block, and otherwise generate the decompressed data block (e.g. 1795) by causing the second data decompressor (e.g. 1710) to decompress the compressed data block (e.g. 1705) according to the second data decompression scheme. The compressed common-value data block may advantageously contain a single bit only. The first data decompressor (e.g. 1720) may configured to conveniently decompress the whole of the compressed data block (e.g. 1705) into the decompressed common-value data block by filling the decompressed common-value data block with a common value. The common data value may typically be a null value or, alternatively, another specific common data value.

A general inventive data decompression method is shown in FIG. 29. In addition to and/or as refinement of the functionality disclosed at 2910-2920 in FIG. 29, this general inventive data decompression method may have any or all of the functional features of the data decompression device according to the general inventive aspect and its various embodiments as described above.

The respective data compression devices disclosed herein may for instance be implemented in hardware, e.g. as digital circuitry in an integrated circuit, as a dedicated device (e.g. a memory controller), as a programmable processing device (e.g. a central processing unit (CPU) or digital signal processor (DSP), as a field-programmable gate array (FPGA), or other logic circuitry, etc. The functionality of the respective data compression methods described herein may for instance be performed by any of the respective data compression devices being appropriately configured, or generally by a device comprising logic circuitry (included in or associated with for instance a processor device/processor chip or memory device/memory chip) configured to perform the respective data compression methods, or alternatively by respective computer program products comprising code instructions which, when loaded and executed by a general-purpose processing device such as a CPU or DSP (for instance any of the processing units P1 . . . Pn of FIGS. 1-5), cause performance of the respective methods.

The respective data decompression devices disclosed herein may for instance be implemented in hardware, e.g. as digital circuitry in an integrated circuit, as a dedicated device (e.g. a memory controller), as a programmable processing device (e.g. a central processing unit (CPU) or digital signal processor (DSP), as a field-programmable gate array (FPGA), or other logic circuitry, etc. The functionality of the respective data decompression methods described herein may for instance be performed by any of the respective data decompression devices being appropriately configured, or generally by a device comprising logic circuitry (included in or associated with for instance a processor device/processor chip or memory device/memory chip) configured to perform the respective data decompression methods, or alternatively by respective computer program products comprising code instructions which, when loaded and executed by a general-purpose processing device such as a CPU or DSP (for instance any of the processing units P1 . . . Pn of FIGS. 1-5), cause performance of the respective methods.

Figure 31:
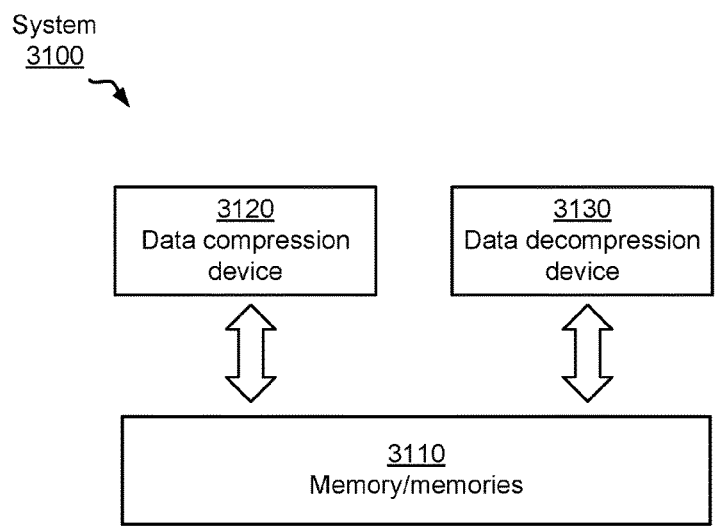
FIG. 31 illustrates a general system comprising a hybrid data compression device and a hybrid data decompression device according to the invention.

FIG. 31 illustrates a general system 3100 according to the invention. The system comprises one or more memories 3110, a data compression device 3120 (such as, for instance, any of the data compression devices 1810; 2510) and a data decompression device 3130 (such as, for instance, any of the data decompression devices 1830; 2530). Advantageously, the system 3100 is a computer system (such as any of the computer systems 100-500 of FIGS. 1-5), and said one or more memories 3110 is/are cache memory/memories (such as any of the cache memories L1-L3 of FIGS. 1-5), random access memory/memories (such as any of the memories 130-530 of FIG. 1-5), or secondary storage/storages. Alternatively, the system 3100 is a data communication system (such as the communication networks 600, 700 of FIGS. 6-7), wherein said one or more memories 3110 may be data buffers associated with transmitting and receiving nodes in the data communication system (such as transmitter 610, 710 and receiver 620, 720 of FIGS. 6-7).

The invention claimed is:

1. A hybrid data compression device for compressing an uncompressed data block into a compressed data block, the uncompressed data block comprising one or a plurality of data values of one or a plurality of data types, the hybrid data compression device comprising:
    a plurality of data compressors, each data compressor configured for a respective data compression scheme, wherein the plurality of data compressors comprises:
        a first data compressor configured for a first data compression scheme, and
        a second data compressor configured for a second data compression scheme, different from the first data compression scheme,
        wherein each of the first and second data compression schemes is a lossless compression scheme or a lossy compression scheme,
        wherein the first data compression scheme is designed to exploit data locality between data values of a first data type, the data locality being temporal, spatial, or a combination thereof, and
        wherein the second data compression scheme is designed to exploit data locality between data values of a second data type, the data locality being temporal, spatial, or a combination thereof; and
    a predictor mechanism configured for predicting data types of data values of the uncompressed data block and for selecting an estimated best suited data compressor among said plurality of data compressors using as a main criterion a dominating data type among the predicted data types,
    wherein the hybrid data compression device is configured to generate the compressed data block by causing the selected estimated best suited data compressor to compress the whole of the uncompressed data block.

2. The hybrid data compression device as defined in claim 1, wherein the hybrid data compression device is configured to generate metadata associated with the compressed data block and wherein the metadata identifies the data compression scheme of the selected estimated best suited data compressor.

3. The hybrid data compression device as defined in claim 2, wherein the hybrid data compression device is configured to store the generated metadata in a data storage together with the compressed data block, the data storage being accessible to a data decompression device, or transmit the generated metadata over a link together with the compressed data block to a data decompression device.

4. The hybrid data compression device as defined in claim 1, wherein the uncompressed data block is one of the following:
    a cache line, cache set, cache block or cache sector for storage in a cache in a computer system,
    a memory row, a memory page or memory sector for storage in a memory or transfer within a computer system,
    a packet, flit, payload or header for transfer over a transmission link in a data communication system; and
    wherein the data types of the data values comprise one or more of: integers, pointers, floating-point numbers, characters, strings, Boolean values, code instructions, or data types defined by a specific format or standard.

5. The hybrid data compression device as defined in claim 1, wherein the predictor mechanism is configured to:
    divide the uncompressed data block into segments;
    for all segments, inspect an inspection bit portion of each segment to classify the segment as a predicted data type among a plurality of candidate data types; and
    compare occurrences of the predicted data types of all segments to determine the dominating data type of the uncompressed data block.

6. The hybrid data compression device as defined in claim 5, wherein the plurality of candidate data types comprise two or more of: integers, pointers, floating-point numbers, characters, strings, Boolean values, common data value block, data code instructions, or data types defined by a specific format or standard.

7. The hybrid data compression device as defined in claim 5, wherein the inspection bit portions are different for different candidate data types.

8. The hybrid data compression device as defined in claim 5, wherein:
one of the candidate data types of the plurality of candidate data types is integer,
a size of the uncompressed data block is m bytes,
a size of the segment is n bytes,
wherein m/n is a multiple of 2,
the inspection bit portion is the p most significant bytes of the segment,
wherein n/p is 2; and
wherein the predictor mechanism is configured to classify the segment as integer if the inspection bit portion is equal to any of a number of predefined p-byte values.

9. The hybrid data compression device as defined in claim 5, wherein:
one of the candidate data types of the plurality of candidate data types is pointer,
a size of the data block is m bytes,
a size of the segment is n bytes,
wherein m/n is a multiple of 2,
the inspection bit portion is the p most significant bytes of the segment,
wherein n/p is 2, and
wherein the predictor mechanism is configured to classify the segment as pointer if the two most significant bytes but not the two least significant bytes of the inspection bit portion are equal to a predefined p/2-byte value.

10. The hybrid data compression device as defined in claim 5, wherein:
one of the candidate data types of the plurality of candidate data types is floating-point numbers,
a size of the data block is m bytes,
a size of the segment is n bytes,
wherein m/n is a multiple of 2, and
the inspection bit portion is the q most significant bits next to the most significant bit of the segment, and
wherein the predictor mechanism is configured to classify the segment as floating-point number by matching the inspection bit portion of the segment with inspection bit portions of neighboring segments in the uncompressed data block, indicative of same or clustered floating-point exponents.

11. The hybrid data compression device as defined in claim 5, wherein:
one of the candidate data types of the plurality of candidate data types is common data value,
a size of the data block is m bytes,
a size of the segment is n bytes,
wherein m/n is a multiple of 2,
the inspection bit portion is the whole segment, and
wherein the predictor mechanism is configured to classify the segment as common data value when all data values of the segment have a same common data value.

12. The hybrid data compression device as defined in claim 5, wherein the hybrid data compression device is configured to select, as the estimated best suited data compressor, a data compressor having common-block-value compression as its data compression scheme when all segments of the uncompressed data block have been classified as common data value.

13. The hybrid data compression device as defined in claim 5, wherein the predictor mechanism is configured, when two different predicted data types of the segments have the same occurrence, to prioritize one over the other when determining the dominating data type of the uncompressed data block.

14. The hybrid data compression device as defined in claim 5, wherein the predictor mechanism is configured, when there are no occurrences of predicted data types of the segments, either to select a default data compressor as the estimated best suited data compressor; or to select no compression instead of an estimated best suited data compressor, hence refraining from compressing the uncompressed data block.

15. The hybrid data compression device as defined in claim 1, further configured to:
during a plurality of compression cycles, monitor the respective selected estimated best suited data compressors with respect to ideal selections of data compressors for the respective dominating data types;
detect that another data compressor would have been more efficient than the estimated best suited data compressor in terms of compressibility of a particular dominating data type;
for future compression cycles, change the estimated best suited data compressor to said another data compressor for the particular dominating data type; and
wherein the ideal selections of data compressors for the respective dominating data types are provided by an oracle selector which compresses the uncompressed data blocks using the data compression schemes of all of the plurality of data compressors and chooses, as the respective ideal selection, the compressor having the data compression scheme which yields best compressibility of the respective uncompressed data block.

16. The hybrid data compression device as defined in claim 1, wherein:
the first data compression scheme comprises a common-block-value compression scheme; and
the second data compression scheme comprises one of statistical (variable-length) encoding, dictionary-based compression, delta encoding, pattern-based compression, and significance-based compression,
wherein the hybrid data compression device is configured to generate, based on the first data compressor being the estimated best suited data compressor if a common data value is found by the predictor mechanism to dominate the uncompressed data block, the compressed data block by causing the first data compressor to compress the whole of the uncompressed data block into a compressed common-value data block, and otherwise generate the compressed data block by causing the second data compressor to compress the whole of the uncompressed data block according to the second data compression scheme.

17. The hybrid data compression device as defined in claim 16, wherein the compressed common-value data block contains a single bit.

18. The hybrid data compression device as defined in claim 16, wherein the predictor mechanism is integrated with the first data compressor.

19. The hybrid data compression device as defined in claim 16, wherein the predictor mechanism is configured to find that the common data value dominates the uncompressed data block when all its data values have the common data value.

20. A hybrid data compression method for compressing an uncompressed data block into a compressed data block, the uncompressed data block comprising one or a plurality of data values of one or a plurality of data types, the hybrid data compression method comprising:
  predicting data types of data values of the uncompressed data block;
  selecting an estimated best suited data compression scheme among a plurality of data compression schemes using as a main criterion a dominating data type among the predicted data types,
    wherein the plurality of data compression schemes comprises a first data compression scheme and a second data compression scheme,
    wherein each of the first and second data compression schemes is a lossless compression scheme or a lossy compression scheme,
    wherein the first data compression scheme is designed to exploit data locality between data values of a first data type, the data locality being temporal, spatial or a combination thereof, and
    wherein the second data compression scheme is designed to exploit data locality between data values of a second data type, the data locality being temporal, spatial or a combination thereof; and
  compressing the whole of the uncompressed data block by the selected estimated best suited data compression scheme to generate the compressed data block.

21. A computer program product comprising code instructions which, when loaded and executed by a processing device, cause performance of the method according to claim 20.

22. A device comprising logic circuitry configured to perform the method according to claim 20.

23. A hybrid data decompression device for decompressing a compressed data block into a decompressed data block comprising one or a plurality of data values of one or a plurality of data types, the hybrid data decompression device comprising:
  a plurality of data decompressors, each decompressor configured for a respective data decompression scheme, wherein the plurality of data decompressors comprises:
    a first data decompressor configured for a first data decompression scheme comprising a common-block-value decompression scheme, and
    a second data decompressor configured for a second data decompression scheme, different from the first data decompression scheme and comprising one of statistical (variable-length) decoding, dictionary-based decompression, delta decoding, pattern-based decompression, or significance-based decompression,
  wherein the hybrid data decompression device is configured to,
    check if the compressed data block is a compressed common-value data block and if so to select the first data decompressor as an estimated best suited data decompressor,
    generate the decompressed data block by causing the estimated best suited data decompressor to decompress the whole of the compressed data block into a decompressed common-value data block, and
    otherwise generate the decompressed data block by causing the second data decompressor to decompress the whole of the compressed data block according to the second data decompression scheme.

24. The hybrid data decompression device as defined in claim 23, wherein the hybrid data decompression device is configured to retrieve metadata associated with the compressed data block and select the estimated best suited data decompressor based on the metadata.

25. The hybrid data decompression device as defined in claim 24, wherein the hybrid data decompression device is configured to retrieve the metadata from a data storage together with the compressed data block, the data storage being accessible to a data compression device, or to receive the metadata over a link together with the compressed data block from a data compression device.

26. The hybrid data decompression device as defined in claim 24,
  wherein each of the first and second data decompression schemes is a lossless decompression scheme or a lossy decompression scheme.

27. The hybrid data decompression device as defined in claim 26, wherein the compressed data block is one of the following:
  a cache line, cache set, cache block or cache sector for storage in a cache in a computer system,
  a memory row, a memory page or memory sector for storage in a memory or transfer within a computer system,
  a packet, flit, payload or header for transfer over a transmission link in a data communication system; and
  wherein the data types of the data values comprise one or more of: integers, pointers, floating-point numbers, characters, strings, Boolean values, code instructions, or data types defined by a specific format or standard.

28. The hybrid data decompression device as defined in claim 23, wherein the compressed common-value data block contains a single bit.

29. The hybrid data decompression device as defined in claim 23, wherein the first data decompressor is configured to decompress the whole of the compressed data block into the decompressed common-value data block by filling the decompressed common-value data block with a common value.

30. A hybrid data decompression method for decompressing a compressed data block into a decompressed data block comprising one or a plurality of data values of one or a plurality of data types, the hybrid data decompression method comprising:
  checking if the compressed data block is a compressed common-value data block;
  selecting, if the compressed data block is a compressed common-value data block, a first data compression scheme as an estimated best suited data decompression scheme among a plurality of data decompression schemes, wherein the plurality of decompression schemes comprises:
    the first data decompression scheme comprising a common-block-value decompression scheme, and
    a second data decompression scheme, different from the first data decompression scheme, comprising one of statistical (variable-length) decoding, dictionary-based decompression, delta decoding, pattern-based decompression, and significance-based decompression; and
  decompressing the whole of the compressed data block by the selected estimated best suited data compression scheme to generate the decompressed data block by decompressing the whole of the compressed data block into a decompressed common-value data block, or otherwise decompressing the whole of the compressed data block according to the second data decompression scheme.

31. A computer program product comprising code instructions which, when loaded and executed by a processing device, cause performance of the method according to claim 30.

32. A device comprising logic circuitry configured to perform the method according to claim 30.

33. A system comprising:
one or more memories;
a data compression device for compressing an uncompressed data block into a compressed data block, the uncompressed data block comprising one or a plurality of data values of one or a plurality of data types, the data compression device comprising:
 a plurality of data compressors, each data compressor configured for a respective data compression scheme, wherein the plurality of data compressors comprises:
  a first data compressor configured for a first data compression scheme, and
  a second data compressor configured for a second data compression scheme, different from the first data compression scheme,
 wherein each of the first and second data compression schemes is a lossless compression scheme or a lossy compression scheme,
 wherein the first data compression scheme is designed to exploit data locality between data values of a first data type, the data locality being temporal, spatial, or a combination thereof, and
 wherein the second data compression scheme is designed to exploit data locality between data values of a second data type, the data locality being temporal, spatial, or a combination thereof; and
 a predictor mechanism configured for predicting data types of data values of the uncompressed data block and for selecting an estimated best suited data compressor among said plurality of data compressors using as a main criterion a dominating data type among the predicted data types,
 wherein the hybrid data compression device is configured to generate the compressed data block by causing the selected estimated best suited data compressor to compress the whole of the uncompressed data block; and
a data decompression device for decompressing the compressed data block into a decompressed data block comprising the one or a plurality of data values of the one or a plurality of data types, the hybrid data decompression device comprising:
 a plurality of data decompressors, each decompressor configured for a respective data decompression scheme, wherein the plurality of data decompressors comprises:
  a first data decompressor configured for a first data decompression scheme comprising a common-block-value decompression scheme, and
  a second data decompressor configured for a second data decompression scheme, different from the first data decompression scheme and comprising one of statistical (variable-length) decoding, dictionary-based decompression, delta decoding, pattern-based decompression, or significance-based decompression,
 wherein the data decompression device is configured to,
  check if the compressed data block is a compressed common-value data block and if so to select the first data decompressor as an estimated best suited data decompressor,
  generate the decompressed data block by causing the estimated best suited data decompressor to decompress the whole of the compressed data block into a decompressed common-value data block, and
  otherwise generate the decompressed data block by causing the second data decompressor to decompress the whole of the compressed data block according to the second data decompression scheme.

34. The system as defined in claim 33, wherein the system is a computer system and wherein said one or more memories are from the group consisting of:
cache memories,
random access memories, and
secondary storages.

35. The system as defined in claim 33, wherein the system is a data communication system and wherein said one or more memories are data buffers.

36. A hybrid data compression device for compressing an uncompressed data block into a compressed data block, the uncompressed data block comprising one or a plurality of data values of one or a plurality of data types, the hybrid data compression device comprising:
a plurality of data compressors, each data compressor configured for a respective data compression scheme; and
a predictor mechanism configured for predicting data types of data values of the uncompressed data block and for selecting an estimated best suited data compressor among said plurality of data compressors using as a main criterion a dominating data type among the predicted data types, wherein the predictor mechanism is configured to:
 divide the uncompressed data block into segments;
 for all segments, inspect an inspection bit portion of each segment to classify the segment as a predicted data type among a plurality of candidate data types; and
 compare occurrences of the predicted data types of all segments to determine the dominating data type of the uncompressed data block, and
wherein the hybrid data compression device is configured to generate the compressed data block by causing the selected estimated best suited data compressor to compress the whole of the uncompressed data block.

37. A hybrid data compression method for compressing an uncompressed data block into a compressed data block, the uncompressed data block comprising one or a plurality of data values of one or a plurality of data types, the hybrid data compression method comprising:
dividing the uncompressed data block into segments;
predicting data types of data values of the uncompressed data block by, for all segments, inspecting an inspection bit portion of each segment to classify the segment as a predicted data type among a plurality of candidate data types;
comparing occurrences of the predicted data types of all segments to determine a dominating data type of the uncompressed data block;
selecting, based on the dominating data type, an estimated best suited data compression scheme from a plurality of data compression schemes; and compressing the whole of the uncompressed data block by the selected estimated best suited data compression scheme to generate the compressed data block.

\* \* \* \* \*